(12) United States Patent
Wu et al.

(10) Patent No.: US 12,720,668 B2
(45) Date of Patent: Aug. 25, 2026

(54) POWER AMPLIFIER MODULES AND SYSTEMS CONTAINING ELECTROMAGNETIC BANDGAP ISOLATION ARRAYS

(71) Applicant: NXP USA, Inc., Austin, TX (US)

(72) Inventors: Yu-Ting David Wu, Schaumburg, IL (US); Pascal Peyrot, Frouzins (FR); Xavier Hue, Frouzins (FR)

(73) Assignee: NXP USA, INC., Austin, TX (US)

( * ) Notice: Subject to any disclaimer, the term of this patent is extended or adjusted under 35 U.S.C. 154(b) by 707 days.

(21) Appl. No.: 18/156,972

(22) Filed: Jan. 19, 2023

(65) Prior Publication Data

US 2023/0232528 A1 Jul. 20, 2023

(30) Foreign Application Priority Data

Jan. 19, 2022 (EP) .................................... 22305054

(51) Int. Cl.
*H05K 1/02* (2006.01)
*H03F 1/02* (2006.01)
(Continued)

(52) U.S. Cl.
CPC ........... *H05K 1/0236* (2013.01); *H03F 3/195* (2013.01); *H03F 3/213* (2013.01); *H05K 1/0206* (2013.01);
(Continued)

(58) Field of Classification Search
CPC .. H05K 1/0236; H05K 1/0206; H05K 1/0209; H05K 2201/10098; H01L 23/66;
(Continued)

(56) References Cited

U.S. PATENT DOCUMENTS

2012/0119969 A1* 5/2012 MacDonald ............ H01L 23/66 343/841
2015/0002226 A1 1/2015 Kuo et al.
2020/0403576 A1* 12/2020 Min ........................ H03F 3/213

FOREIGN PATENT DOCUMENTS

EP 2555326 A1 2/2013
EP 3664287 A1 6/2020

OTHER PUBLICATIONS

Yang, Fan et al.; "Microstrip Antennas Integrated with Electromagnetic Band-Gap (EBG) Structures: A Low Mutual Coupling Design for Array Applications"; IEEE Trans. On Antennas and Propagation, vol. 51, No. 10; Oct. 2003.

(Continued)

*Primary Examiner* — Norman D Richards
*Assistant Examiner* — Sean Ayers Winters

(57) ABSTRACT

Power amplifier systems including power amplifier modules (PAMs) and electromagnetic bandgap (EBG) isolation structures are disclosed. In embodiments, the power amplifier system includes a printed circuit board (PCB) and a PAM mounted to the PCB in an inverted orientation. The PCB has a PCB frontside on which a PAM mount region is provided, and radio frequency (RF) input and output bondpads. The PAM includes a topside input/output interface having RF input and output terminals electrically coupled to the RF input and output pads, respectively. The power amplifier system further includes a first EBG isolation structure containing a first grounded EBG cell array, at least a portion of which is located within or beneath the PAM mount region.

20 Claims, 7 Drawing Sheets

(51) Int. Cl.

*H03F 3/195* (2006.01)
*H03F 3/213* (2006.01)
*H10W 44/20* (2026.01)

(52) U.S. Cl.

CPC .......... *H05K 1/0209* (2013.01); *H10W 44/20* (2026.01); *H03F 1/0288* (2013.01); *H03F 2200/451* (2013.01); *H05K 2201/10098* (2013.01); *H10W 44/206* (2026.01); *H10W 44/212* (2026.01); *H10W 44/234* (2026.01); *H10W 44/241* (2026.01)

(58) Field of Classification Search

CPC ..... H01L 2223/6611; H01L 2223/6622; H01L 2223/6655; H01L 2223/6672; H03F 3/195; H03F 3/213; H03F 1/0288; H03F 2200/451; H10W 44/20; H10W 44/234; H10W 44/241; H10W 44/212; H10W 44/206

See application file for complete search history.

(56) References Cited

OTHER PUBLICATIONS

Cheng, Hai Rong et al.; "Design of a Novice EBG Structure and its Application in Fractal Microstrip Antenna"; Progress In Electromagnetics Research C, vol. 11, 81-90; Jan. 2009; DOI:10.2528/PIERC09091403.

Kim, Youngwoo et al.; "Glass Interposer Electromagnetic Bandgap Structure for Efficient Suppression of Power/Ground Noise Coupling"; IEEE Transactions on Electromagnetic Compatibility; Jun. 2017; vol. 59, No. 3.

Radhi, Alaa H. et al.; "Mutual Coupling Reduction Between Two PIFA Using Uni-Planar Fractal Based EBG for MIMO Application"; 2016 Loughborough Antennas & Propagation Conference (LAPC); Nov. 14-15, 2016, Loughborough, UK; DOI: 10.1109/LAPC.2016.7807564.

Reha, Abdelati et al.; "The Behavior of CPW-Fed Sierpinski Curve Fractal Antenna"; Journal of Microwaves, Optoelectronics and Electromagnetic Applications, vol. 17, No. 3, Sep. 2018; DOI: http://dx.doi.org/10.1590/2179-10742018v17i31244.

* cited by examiner

POWER AMPLIFIER MODULES AND SYSTEMS CONTAINING ELECTROMAGNETIC BANDGAP ISOLATION ARRAYS

CROSS-REFERENCE TO RELATED APPLICATIONS

This application claims priority under 35 U.S.C. § 119 to European Patent Application No. 22305054.3, filed on Jan. 19, 2022, the contents of which are incorporated by reference herein.

TECHNICAL FIELD

Embodiments of the present disclosure relate generally to microelectronics and, more particularly, to power amplifier modules and systems containing electromagnetic bandgap (EBG) isolation arrays.

BACKGROUND

A power amplifier module (PAM) contains at least one semiconductor die bearing a transistor integrated circuit, which is utilized for radio frequency (RF) signal or power amplification purposes. In the case of a Doherty PAM, for example, at least one carrier RF power die and at least one peaking RF power die are contained within the body of the PAM. The PAM may be mounted to a system-level substrate, such as a motherboard or another printed circuit board (PCB), which may contain or support other circuit elements included in a larger power amplifier circuit Advancements in PAM performance and reductions in PAM size have been achieved through various innovations, including through the development of multistage power amplifiers and certain die technologies having high power densities (e.g., gallium nitride and other layered die substrates). However, many PAMs, and power amplifier systems generally, remain vulnerable to stability issues and undesired electromagnetic coupling or cross-talk, particularly as PAMs grow smaller in size and increasingly power dense. An ongoing demand thus persists for advancements enabling further optimization of electrical performance characteristics of a given PAM, while also promoting module miniaturization, supporting efficient heat dissipation, and providing other benefits.

BRIEF DESCRIPTION OF THE DRAWINGS

At least one example of the present invention will hereinafter be described in conjunction with the following figures, wherein like numerals denote like elements, and.

Figure 1:
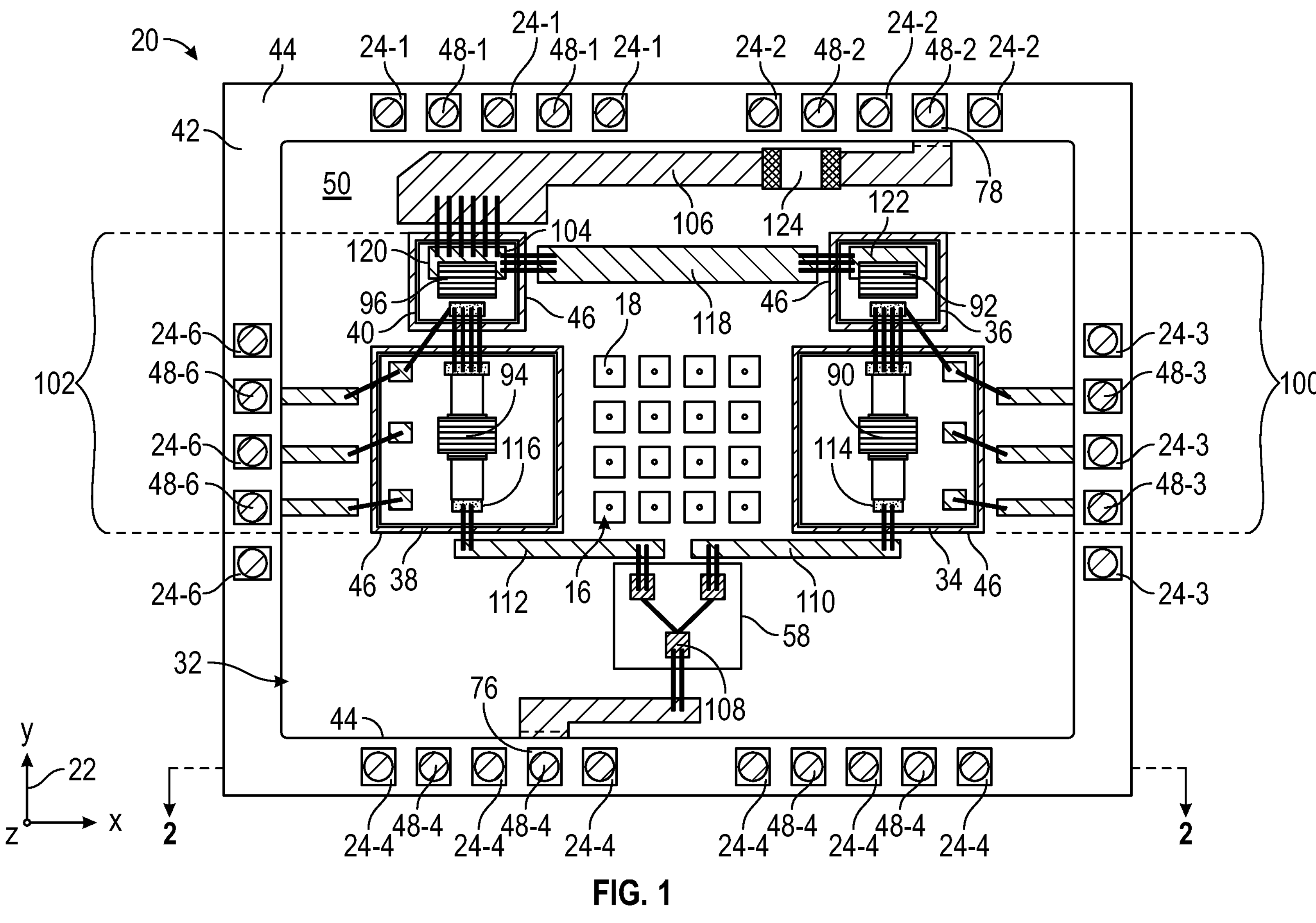
FIG. 1 is a simplified top-down or planform view of a power amplifier module (PAM) including an electromagnetic bandgap (EBG) isolation structure and having a high thermal performance (HTP) architecture, shown in a pre-encapsulated state, and illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

As appearing throughout this document, the term "module" encompasses the term "package." By extension, the term "power amplifier module" encompasses the term "power amplifier package." The term "integrated circuit die" or "IC die," as further appearing herein, encompasses integrated passive devices, metal-oxide-semiconductor capacitor devices, and other such circuit elements, which are formed on discrete, semiconductor material-containing die; as well as semiconductor material-containing dies containing more complex active integrated circuits, such as transistor amplifier circuits of the type described below. Finally, as still further appearing herein, the term "printed circuit board" generally encompasses any substrate including electrical routing features and supporting one or more microelectronic components, such as IC dies; while the term "system-level printed circuit board" refers to a printed circuit board (PCB) having at least one module mount region to which a power amplifier module (PAM) is or may be attached.

Overview

The following describes system-level PCBs and PAMs, which combine to produce power amplifier systems. A given power amplifier system incorporates at least one electromagnetic bandgap (EBG) isolation structure, which serves to reduce the susceptibility of the system to undesired electromagnetic (EM) coupling, such as input-output coupling, which may otherwise detract from power amplifier performance. Depending upon the particular manner in which the power amplifier system is implemented, at least one EBG isolation structure may be integrated into a system-level PCB, a PAM mounted to the system-level PCB, or both the system-level PCB and the PAM (or PAMs) mounted thereto. Regardless of the particular location into which a given EBG isolation structure is integrated, the EBG isolation structure may include an array of grounded EBG cells, electrically-conductive EBG vias, and a ground plane. The EBG vias extend from the individual EBG cells to the ground plane (e.g., in a direction away from the module region of the PAM) to electrically ground the EBG cell array. The EBG cells included in the EBG cell array can be imparted with various repeating planform geometries, ranging from relatively simple (e.g., square-shaped or elongated rectangular) planform geometries to more complex planform geometries including spiral (e.g., split ring) and repeating fractal (e.g., Sierpinski) shapes. The EBG cells may be defined by patterning of a metal layer included in a system-level PCB, such as the uppermost layer of a PCB to which a PAM is mounted; or a metal layer of a module substrate contained within the PAM, which may also assume the form of a smaller PCB in embodiments. As described more fully below, the spacing, geometry, and dimensions of the EBG cells, as well as other structural aspects of the EBG isolation structure, may be tuned to provide targeted attenuation of EM energy generated over the operational frequency of the PAM; the term "attenuation," as utilized in this context, referring to the ability of the EBG isolation structure to shunt stray EM energy incident upon the EBG array to ground. This, in turn, provides optimized EM shielding effect to enhance signal-to-noise ratios and other electrical performance aspects of the power amplifier system during operation thereof.

Embodiments of the EBG isolation structure may be integrated into a system-level PCB or a PAM mounted to the system-level PCB at a designated location, with the region of the PCB covered by the PAM referred to as the "module mount region." When an EBG isolation structure is integrated into the PCB, the grounded EBG cell array may be formed in or adjacent (e.g., immediately beneath) the module mount region. For example, in embodiments, the grounded EBG cell array may be formed as a repeating geometric pattern, which is defined in the uppermost patterned metal layer of the system-level PCB and which occupies or spans a relatively large (e.g., central) portion of the module mount region; e.g., in certain cases, the EBG cell array may be formed to span or cover a majority of the module mount region, by surface area. Concurrently, the uppermost PCB metal layer may also be patterned to define rows of input/output (I/O) bondpads, which may be positioned around the outer periphery of the module mount region, with the PCB I/O bondpad rows potentially flanking one or more sides of the EBG cell array. In this case, the PCB I/O bondpad rows may include at least one radio frequency (RF) input bondpad and at least one RF output bondpad, which are electrically coupled to corresponding terminals provided on the PAM when attached to the module mount region of the system-level PCB. The corresponding terminals of the PAM are referred to herein as an "RF input terminal" and an "RF output terminal," respectively; and, when formed on the PAM topside surface, are specifically referred to as a "topside RF input terminal" and a "topside RF output terminal." In such embodiments, at least a portion of the grounded EBG cell array may be formed at a location between the RF input bondpad and at least one RF output bondpad to reduce the susceptibility of the power amplifier system to input-output coupling. In other embodiments, the grounded EBG cell array be formed in an internal layer of the PCB, such as the patterned metal layer immediately below the uppermost patterned metal layer, providing the EBG cell remains in sufficient proximity of the module mount region to provide the desired EM shield effect.

An EBG isolation structure may be integrated into a given PAM in addition to or in lieu of incorporation of an EBG isolation structure into a system-level PCB of the power amplifier system. In this regard, a given PAM may be fabricated to include an EBG isolation structure having a grounded EBG cell array, which is distributed along or adjacent the PAM topside surface; e.g., by formation of the EBG cell array in a lid utilized to enclose the PAM or by embedment of an interposer piece within a molded package body of the PAM, with the interposer piece having an upper metal layer located adjacent (e.g., substantially coplanar with) the PAM topside surface and patterned to define the EBG cell array. In other implementations, the EBG cell array of the EBG isolation structure may be integrated into a module substrate, such as a smaller PCB, which is contained within the PAM and to which one or more IC dies (e.g., power amplifier or transistor dies) are attached. In this latter case, the EBG isolation structure may again include a grounded EBG cell array formed in a patterned metal layer (e.g., the uppermost metal layer) of the module substrate, a ground plane formed in an internal or backside metal layer of the module substrate, and EBG vias extending within the module substrate in a thickness direction to electrically couple the individual EBG cells to the ground plane. Depending upon spatial constraints and similar factors, the expanse of the EBG cell array may be confined to a localized region (or regions) of the module substrate, which is located between and effectively partitions electrically-conductive transmission paths carrying disparate electrical signals through the PAM. Cross-talk or undesired EM cross-coupling between such signal paths may consequently be minimized, if not prevented. As a more specific example, the EBG cell array may be located between carrier and peaking amplification paths, which extending within the PAM when imparted with a Doherty amplifier layout Additionally or alternatively, the grounded EBG cell array may be formed between RF input and RF output bondpads located on the populated frontside or "die support surface" of the module substrate. In still other implementations, the EBG cell array may be located elsewhere within the PAM to provide the desired EM shielding function; or the PAM may lack an EBG isolation structure, with enhanced EM shielding provided by an EBG isolation structure isolation integrated into the system-level PCB.

Regardless of whether containing an integrated EBG isolation structure, a given PAM included in the presently-disclosed power amplifier systems may be beneficially fabricated to have a so-called "high thermal performance" or "HTP" architecture; that is, an architecture in which the I/O interface of the PAM is produced along the PAM topside surface, while a thermal/heat extraction interface (e.g., one or more metallic surfaces having a low thermal resistance coupling to IC dies within the PAM) is availed along the opposing backside surface of the PAM. By fabricating the PAM to include such an HTP architecture, the heat dissipation capabilities of the PAM can be boosted to limit peak operational temperatures occurring within the PAM, particularly when operated at higher power levels and frequencies or containing power amplifier dies having relatively high power densities. In certain cases in which a PAM possesses such an HTP architecture, the PAM is fabricated to contain one or more interposer pieces (e.g., PCB blocks or electrically-routed ceramic pieces), which are embedded within a molded package body partly defining a PAM topside surface located opposite a module substrate PAM. The interposer piece(s) may contain upper interposer pads exposed along the PAM topside surface to define the terminals of the topside I/O interface, lower interposer pads, and interposer vias extending within dielectric regions of the interposer piece(s) to electrically couple corresponding pairs of the upper and lower interposer pads. The lower interposer pads are bonded to the module substrate or otherwise electrically coupled to the microelectronic components (e.g., power amplifier dies) within the PAM. Thus, by virtue of such a design, an unamplified RF signal supplied to the PAM via the system-level PCB may enter the PAM through a topside RF input terminal; travel upwardly away from the PCB and toward the module substrate through a first interposer piece or region; travel through the power amplifier die or dies contained within the PAM, undergoing signal amplification and crossing-over the grounded EBG array when formed in the module mount region; travel downwardly toward the PCB and toward the module substrate through a second interposer piece or region; and ultimately be discharged as an amplified RF signal appearing at the RF output terminal of PAM. Additional description of such an RF signal routing scheme is illustrated and described below in connection with FIG. 6.

An example power amplifier system, which contains multiple EBG isolation structures, will now be described in connection with FIGS. 1-6. In the below-described example embodiment, EBG isolation structures are incorporated into both a system-level PCB and into the module substrate of a PAM, which is attached to the module mount region of a system-level PCB in an inverted orientation. The following example notwithstanding, alternative embodiments of the power amplifier system can contain any number of EBG isolation structures, which may be integrated exclusively into the system-level PCB, exclusively into the PAM (or PAMs) mounted to the PCB, or integrated into both the power amplifier system and the supported PAM or PAMs. Moreover, while described below in connection with an example PAM having a HTP architecture and a quad flat no-lead (QFN) or land grid array (LGA) formfactor, alternative embodiments of the presently-disclosed PAMs may be fabricated to possess non-HTP architectures and a wide range of formfactors, including other flat no-lead formfactors (e.g., dual flat no-lead (DFN) designs) and ball grid array (BGA) formfactors. In the first example initially set-forth below in connection with FIGS. 4-6, the EBG isolation structure includes an array of EBG cells having relatively simple, square-shaped planform geometries, which cooperate with the EBG vias to form three dimensional mushroom-shaped structures extending upwardly from a ground plane, as viewed along a section plane orthogonal to the EBG cell array. Alternative embodiments of the EBG isolation structure may include EBG cell arrays having various other planform geometries, typically realized as one or more repeating geometric patterns, to provide the desired attenuation (e.g., shunting of EM energy incident upon the EBG cell array to ground) or termination effect reducing the susceptibility of the power amplifier system to undesired EM coupling or cross-talk. Further illustrating this point, an additional example of an EBG isolation system integrated into a system-level PCB and having a more complex (split ring) EBG cell topology is described below in connection with FIG. 7. Finally, an example embodiment of an EBG isolation system, which is integrated into a module substrate and positioned between carrier and peaking amplification paths of a PAM having a Doherty circuit layout, is discussed below conjunction with FIG. 8.

Figure 2:
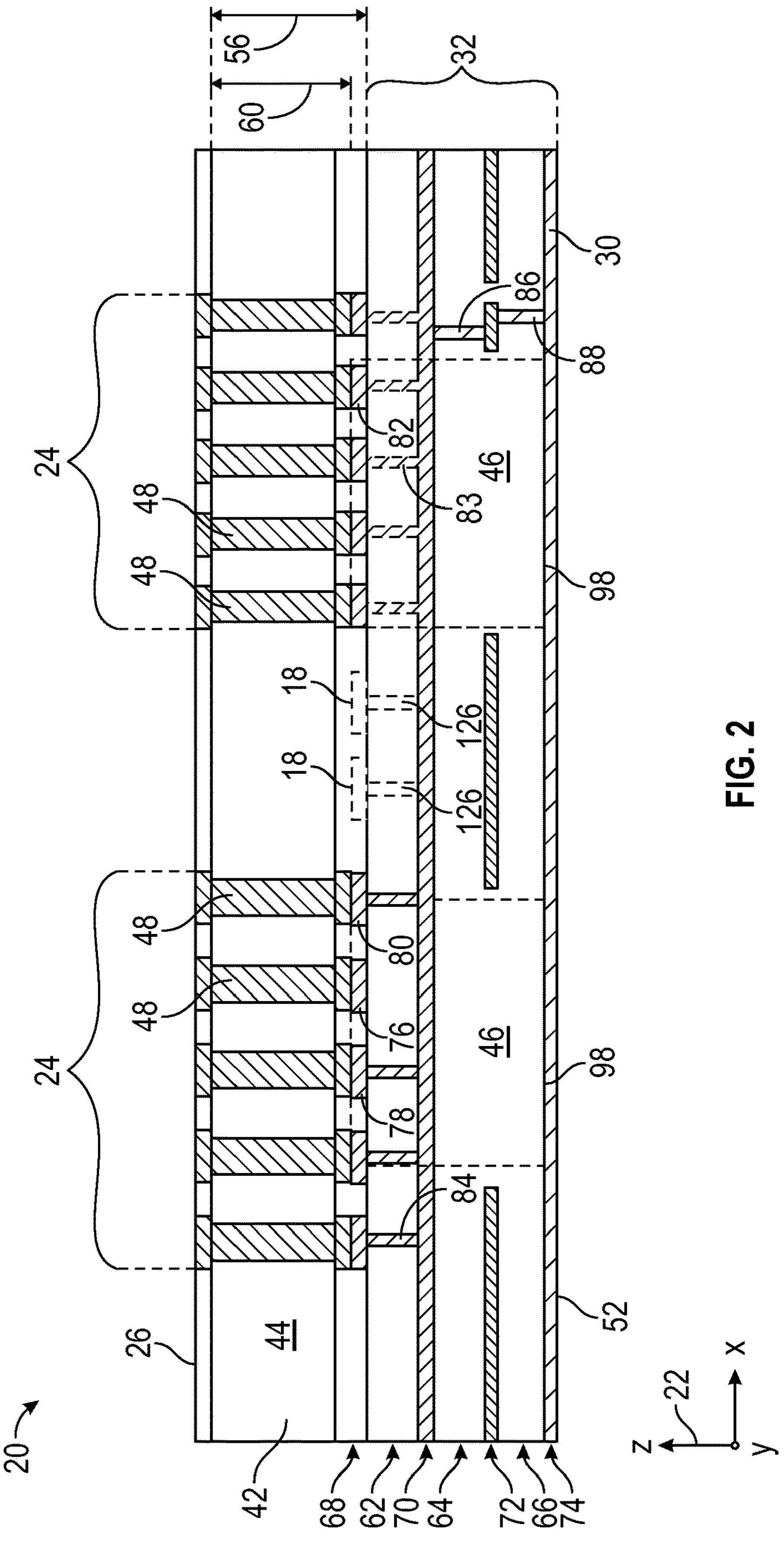
FIG. 2 is a side cross-sectional view of the example PAM shown in FIG. 1, as taken along a section plane 2-2 identified in FIG. 1.
Figure 3:
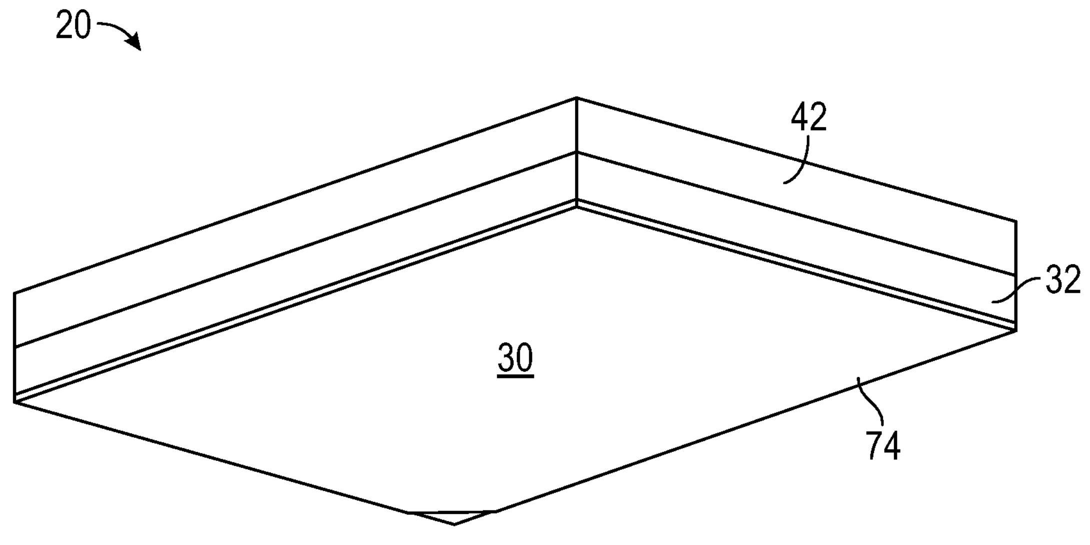
FIGS. 3 and 4 are bottom and top isometric views, respectively, of the example PAM shown in FIGS. 1 and 2.

Example Power Amplifier Module and System-Level Substrate Containing EBG Isolation Structures FIGS. 1 and 2 are top planform and side cross-sectional views of a power amplifier module 20 (hereafter, "PAM 20"), respectively, as illustrated in accordance with an example embodiment of the present disclosure. PAM 20 is illustrated prior to encapsulation in FIG. 1 to more clearly illustrate the microelectronic components and circuit elements within PAM 20 including an EBG isolation structure 16, which contains an array of electrically-grounded EBG cells 18. Upper and lower isometric views of PAM 20 are further presented in FIGS. 3 and 4, respectively, with an encapsulant layer or overmold body 28 suitably included in PAM 20 visible in FIG. 4. When incorporated into a larger power amplifier system or assembly, PAM 20 is mounted to a system-level substrate, such as a motherboard or another electrically-routed PCB (e.g., PCB 134 shown and discussed in connection with FIGS. 5 and 6), with the topside terminals of PAM 20 (described below) electrically coupled to corresponding bondpads located on the populated frontside of the PCB. When so mounted, PAM 20 covers a surface area region of the PCB, which is referred to herein as the "module mount region." An EBG isolation structure including a grounded EBG cell array, which may be similar to EBG cell array 18 of EBG isolation structure 16, may be integrated into the module mount region for enhanced EM shielding in embodiments. Further discussion in this regard is provided below in connection with FIGS. 5-8. First, however, PAM 20 is described in greater detail with FIGS. 1-4 to establish an example context in which embodiments of the present disclosure may be better understood.

PAM 20 includes an opposing principal surfaces 26, 30, which are referred to herein as "topside surface 26" and "bottomside surface 30," respectively. Surfaces 26, 30 are opposed along the Y-axis of a coordinate legend 22 appearing in the lower left of FIGS. 1 and 2, which is also referred to as a "vertical," a "module thickness," or a "PCB thickness" direction herein. As previously alluded to, PAM 20 is imparted with a dual-sided HTP architecture in the illustrated example. To this end, PAM 20 is fabricated to include a topside I/O interface defined by a number of topside bondpads or terminals 24, as well as a thermal (heat extraction) interface availed along bottomside surface 30 of PAM 20. The bottomside thermal interface may assume the form of one or more metallic surfaces accessible from, and perhaps coplanar with, backside surface 30 and located opposite module topside surface 26, as taken in a module thickness direction. In the illustrated example, bottomside surface 30 of PAM 20 is defined by a plated metal layer or multi-layer system 74 (herein, "backmetal layer 74"), which serves as the thermal interface of PAM 20 and which covers the backside or bottommost surface of a module substrate 32. When PAM 20 is installed within a larger microelectronic system, the outboard thermal interface of PAM 20 may further be placed in thermal communication with a heatsink (e.g., a metal chassis or fin array) contained in a power amplifier system to promote conductive heat extraction from the interior of PAM 20 and dissipation by convective transfer to the surrounding ambient environment, as described more fully below in connection with FIG. 6.

As shown in FIG. 1, PAM 20 contains a module substrate 32 having a populated frontside surface 50 (also referred to as "die support surface 50") to which a number of microelectronic components, including power transistor or amplifier dies 34, 36, 38, 40, are mounted. In the illustrated example, module substrate 32 assumes the form of a multilayer PCB; however, in other embodiments, module substrate 32 can assume other forms, whether containing or lacking electrical-routing features (e.g., Cu traces), including that of a leadframe-based substrate. To establish electrical connections between dies 34, 36, 38, 40 and the other circuit components contained within PAM 20, a plurality of column-like electrical connections extend from contacts or bondpads provided on module substrate frontside 50 to bondpads or terminals 24 exposed along topside surface 26 of PAM 20, thereby forming the topside surface I/O interface of PAM 20. Such column-like electrical connections (also referred to herein as "vertical electrical connections") can be provided in various other manners, including by positioning and bonding in place discrete electrically-conductive (e.g., metallic) rod-like pieces. For process efficiency, such vertical electrical connections are conveniently provided in the form of one or more interposer pieces, which contain a dielectric (e.g., ceramic or polymeric) body in which such vertical electrical connections are contained, whether as filled vias, plated vias, or as embedded electrically-conductive (e.g., Cu) bodies; the term "via" utilized herein to encompass all such structural elements providing electrical connections in a thickness direction (corresponding to the Y-axis of coordinate legend 22). In the illustrated example, specifically, a single interposer piece 42 having a generally rectangular ring-shaped geometry is utilized for this purpose and is referred to hereafter as "interposer ring 42." Interposer ring 42 containing a dielectric body 44, upper interposer terminals or pads 24 arranged in six rows or groupings, and filled interposer vias 48 underlying interposer pads 24. Interposer ring 42 is shaped and sized to extend around an outer periphery of a populated surface 50 of module substrate 32 (also referred to herein as a "die support surface"), as further discussed below.

Figure 4:
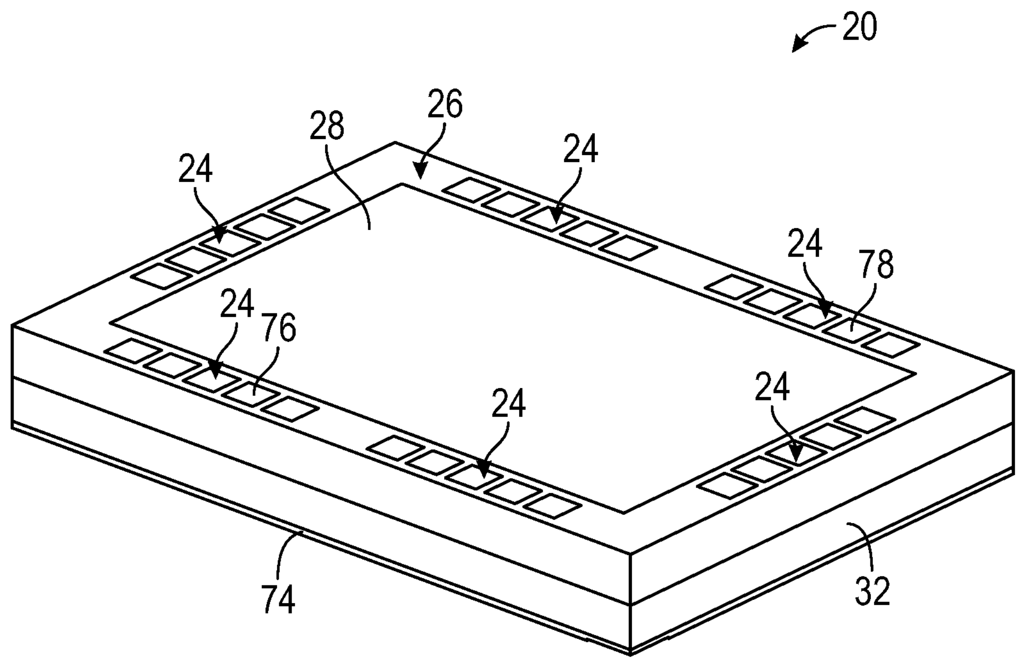

A plurality of components (including power transistor dies 34, 36, 38, 40) and interposer ring 42 are coupled to populated surface 50 of module substrate 32, and non-conductive encapsulant material 28 (e.g., an epoxy glob top, a thermoset material, or another dielectric material) is deposited onto and bonded with populated surface 50. Encapsulant material 28 surrounds (extends over and around) the electrical components of PAM 20 and contacts the interior periphery of interposer ring 42 to define a contact surface (corresponding to topside surface 26) of PAM 20 on which the PAM I/O interface is exclusively or at least principally provided. As identified in FIG. 2, encapsulant material 28 may be imparted with a thickness 56 greater than the maximum height of the components (e.g., the below-described power splitter 58 and power transistor dies 34, 36, 38, 40) covered by encapsulant material 28 (FIG. 4). In certain embodiments, this thickness (dimension 56) is substantially equivalent to the height (dimension 60) of interposer ring 42, although this thickness may be slightly less or greater than the height of interposer ring 42 in other embodiments. Lower or proximal surfaces of interposer ring 42, and more particularly proximal ends of the terminals (e.g., vias-in-pads 24, 48) embedded within interposer ring 42, may be coupled to conductive features on populated surface 50 of module substrate 32 in embodiments.

As depicted in FIG. 2, module substrate 32 includes several dielectric layers 62, 64, 66 (e.g., composed of FR-4, ceramic, or other PCB dielectric materials), which are disposed in an alternating or interleaved arrangement with a number of patterned metal layers 68, 70, 72, 74. Populated surface 50 of module substrate 32 is at least partially defined by a patterned metal layer 68, while non-populated surface 52 of module substrate 32 is defined by a patterned metal layer 74 or a continuous ground plane layer. While module substrate 32 is shown to include three dielectric layers 62, 64, 66 interspersed with four patterned metal layers 68, 70, 72, 74, other embodiments of module substrate 32 may include a greater or lesser number of dielectric layers and patterned metal layers. Each of the various patterned metal layers 68, 70, 72, 74 may have a primary purpose, and also may include conductive features facilitating signal and/or voltage/ground routing between other layers. Although the description below indicates a primary purpose for each of patterned metal layers 68, 70, 72, 74, the layers (or their functionality) may be arranged differently relative to the illustrated arrangement. For example, in alternative embodiments of module substrate 32, patterned metal layer 68 at populated surface 50 of module substrate 32 may primarily function as a signal conducting layer in addition to being patterned to define the below-described grounded EBG cell array 18 of EBG isolation structure 16 (when present within module substrate 32). In this case, patterned metal layer 68 may include a plurality of conductive features (e.g., conductive pads and traces) serving as attachment points for dies 34, 36, 38, 40 and other discrete components, as well as providing electrical connectivity between dies 34, 36, 38, 40 and the other discrete components.

In the illustrated embodiment, uppermost metal layer 68 of module substrate 32 is patterned to define a number of electrically-conductive bondpads 76, 78, 80 (FIG. 2) for attachment of electrically conductive signal, bias, and/or ground terminals within interposer ring 42. In certain instances, patterned metal layer 68 may also include a plurality of "dummy" pads, such as one or more bondpads 82 (FIG. 2), to which "dummy" terminals may be attached. As appearing herein, the term "dummy terminal" refers to an interposer terminal that is not assigned any particular function in an amplifier IC or PAM and, therefore, is electrically decoupled from any active circuitry. In various embodiments, the dummy terminals and dummy pads 82 may be remain electrically floating (that is, left uncoupled to ground or other circuitry); or, alternatively, may be coupled to a ground layer, such as internal ground plane layer 70, as indicated by dashed line vias 83. The conductive features of patterned metal layer 70 may be electrically coupled to various conductive features of patterned metal layer 68 (a signal conducting layer) and to patterned metal layer 74 (e.g., a system ground layer) with conductive vias 84, 86, 88 extending through dielectric layers 62, 64, 66. For example, conductive ground terminal pads 78, 80 may be electrically coupled through vias 84 to patterned metal layer 70. A third patterned metal layer 72 functions to convey bias voltages to power transistors 90, 92, 94, 96 within dies 34, 36, 38, 40, and also may function as a routing layer, as mentioned above. Finally, a fourth patterned metal layer 74 functions as a system ground layer and also as a heatsink attachment layer in embodiments.

Module substrate 32 may further contain one or more thermal dissipation structures 46, which extend between surfaces 26, 50 of module substrate 32. When so provided, IC dies 34, 36, 38, 40 may be physically and electrically coupled to the uppermost surfaces of thermal dissipation structures 46 exposed at topside surface 26 of module substrate 32. Bottom surfaces 98 of thermal dissipation structures 46 may be exposed at non-populated surface 52 of module substrate 32, or bottom surfaces 98 of thermal dissipation structures 46 may be covered with bottommost metal layer 74, as shown in FIG. 2. In either instance, thermal dissipation structures 46 provide a thermal pathway between dies 34, 36, 38, 40 and bottom surfaces 98 of thermal dissipation structures 46 and, therefore, non-populated surface 52 of module substrate 32. In various embodiments, thermal dissipation structures 46 may include conductive metallic coins press-fit and/or otherwise attached into through-holes extending between sides or surfaces 26, 30 of module substrate 32. In alternative embodiments, each of thermal dissipation structures 46 may include a plurality or a set of conductive thermal vias, such as circular or bar vias, extending between principal surfaces or sides 26, 30 of module substrate 32. As described in more detail below, exposed bottom surfaces 98 of thermal dissipation structures 46 (or the portion of patterned metal layer 74 overlying those surfaces 98) are physically and thermally coupled to a heatsink when PAM 20 is integrated within a larger electrical system.

The terminals or contacts included in topside I/O interface 24 of PAM 20 include an RF input terminal 76 and an RF output terminal 78 (identified in FIGS. 1 and 4). The following circuit elements or components are contained within PAM 20 and electrically coupled between terminals: (i) a power splitter 58; (ii) a two-stage, carrier amplifier section 100; (iii) a two-stage peaking amplifier section 102; (iv) a number of phase shift and impedance matching elements; (v) a combining node 104; and (vi) an output-side impedance matching network 106. Through one or more electrically-conductive structures or interconnect features (e.g., vias, traces, and/or wirebonds, as shown), RF input terminal 76 is electrically coupled to an input 108 of power splitter 58. Similarly, through one or more interconnect features (e.g., vias, traces, and/or wirebonds), RF output terminal 78 is electrically coupled to combining node 104 via output-side impedance matching network 106. Power splitter 58 is coupled to populated surface or die support surface 50 of module substrate 32 and may include one or more discrete die and/or components. As noted above, power splitter 58 includes an input terminal 108 and two output terminals (not labeled). Input terminal 108 of power splitter 58 is electrically coupled to RF input terminal 76 through one or more conductive structures (e.g., vias, traces, and/or wirebonds, as shown). The output terminals of power splitter 58 are electrically coupled through one or more conductive structures (e.g., vias, traces, and/or wirebonds) and input circuits 110, 112 to inputs 114, 116 of carrier and peaking amplifier sections 100, 102, respectively. Power splitter 58 is configured to divide the power of the input RF signal received through the RF input terminal into first and second RF signals, which are produced at the output terminals of power splitter 58. In addition, power splitter 58 may include one or more phase shift elements configured to impart a 90 degree phase difference between the RF signals provided at the splitter output terminals.

The first output of power splitter 58 is electrically coupled to a carrier amplification path extending within PAM 20, while the second output of power splitter 58 is electrically coupled to a peaking amplification path within PAM 20. The RF signal produced at the second output of splitter 58 may be delayed by about 90 degrees from the RF signal produced at the first power splitter output Stated differently, the RF signal provided to the peaking amplification path may be delayed by about 90 degrees from the RF signal provided to the carrier amplification path. Due to this arrangement, the first RF signal generated by power splitter 58 is amplified through the carrier amplification path, while the second RF signal produced by power splitter 58 is amplified through the peaking amplification path. In the embodiment of FIG. 1, each of the carrier and peaking amplification paths extends through a two-stage power amplifier section in which a driver-stage transistor 90, 94 is implemented on a driver-stage die 34, 38, while a final-stage transistor 92, 96 is implemented on a separate final-stage die 36, 40. For example, each of transistors 90, 92, 94, 96 may be field effect transistors (FETs), such as laterally-diffused metal oxide semiconductor (LDMOS) FETs or high electron mobility transistors (HEMTs). The description and claims may refer to each transistor as including a control terminal and two current-conducting terminals. For example, utilizing terminology associated with FETs, a "control terminal" refers to a gate terminal of a transistor, and first and second current-conducting terminals refer to drain and source terminals (or vice versa) of a transistor. Although the below description may use terminology commonly used in conjunction with FET devices, the various embodiments are not limited to implementations the utilize FET devices, and instead are meant to apply also to implementations that utilize bipolar junction transistors (BJT) devices or other suitable types of transistors.

In the illustrated example, carrier amplifier section 100 of PAM 20 includes a silicon driver-stage die 34 and a gallium nitride (GaN) final-stage die 36; while peaking amplifier section 102 likewise includes a silicon driver-stage die 38 and a GaN final-stage die 40. In other embodiments, each of carrier and peaking amplifier sections 100, 102 may include a two-stage power amplifier implemented on a single die, or each of carrier and peaking amplifier sections 100, 102 may include a single-stage power amplifier implemented on a single die. In still other implementations, each of carrier and peaking amplifier section 100, 102 may include a two-stage power amplifier implemented on separate driver and final-stage dies, but the driver and final-stage dies may be formed utilizing the same semiconductor technology (e.g., both the driver and final-stage dies are silicon dies or GaN dies), or the driver and/or final-stage dies may be formed utilizing different semiconductor technologies than those described above (e.g., the driver and/or final-stage dies may be formed from silicon germanium (SiGe) and/or gallium arsenide (GaAs) die).

With continued reference to FIGS. 1-4, and with attention specifically directed towards FIG. 1, carrier amplification section 100 includes above-mentioned driver-stage die 34, final-stage die 36, and a phase shift and impedance inversion element 118. Driver-stage die 34 and final-stage die 36 of carrier amplifier section 100 may be electrically coupled in a cascade arrangement between an input terminal 114 of driver-stage die 34 (corresponding to a carrier amplifier input) and an output terminal 122 of final-stage die 36 (corresponding to a carrier amplifier output). In embodiments, the integrated circuitry of driver-stage die 34 may include a series-coupled arrangement of input terminal 114, a silicon power transistor 90, and the following non-labeled features: an input impedance matching circuit, an integrated portion of an interstage impedance matching circuit, and an output terminal. The gate of transistor 90 is electrically coupled through the input impedance matching circuit to input terminal 114, while the drain of transistor 90 is electrically coupled through the output-side impedance matching circuit to the output terminal of die 34. The source of transistor 90 is electrically coupled to a patterned metal layer (or source terminal) on a bottom surface of die 34; and the bottom patterned metal layer is physically, electrically, and thermally coupled to the exposed top surface of a thermal dissipation structure 46. The output terminal of driver-stage die 34 is electrically coupled to the input terminal of final-stage die 36 through a wirebond array or another type of electrical connection. Final-stage die 36 also includes a plurality of integrated circuits; e.g., a series-coupled arrangement of an input terminal (not numbered), a GaN power transistor 92, and an output terminal 122. The gate of transistor 92 may be electrically coupled to the input terminal of die 36, and the drain of transistor 92 is electrically coupled to output terminal 122 of die 36. The source of transistor 92 is electrically coupled to a patterned metal layer on a bottom surface of die 36; and the bottom patterned metal layer is physically, electrically, and thermally coupled to the exposed top surface of a thermal dissipation structure 46.

The peaking amplification path includes the above-mentioned driver-stage die 38 and final-stage die 40. Driver-stage die 38 and final-stage die 40 of the peaking amplification path are electrically coupled together in a cascade arrangement between an input terminal 116 of driver-stage die 38 (corresponding to a peaking amplifier input) and an output terminal 120 of final-stage die 40 (corresponding to a peaking amplifier output). Driver-stage die 38 may include a plurality of ICs. In an embodiment, the integrated circuitry of die 38 includes a series-coupled arrangement of input terminal 116, an input impedance matching circuit (not numbered), a silicon power transistor 94, an integrated portion of an interstage impedance matching circuit (not numbered), and an output terminal not numbered, in an embodiment More specifically, the gate of transistor 94 is electrically coupled through the input impedance matching circuit to input terminal 116, and the drain of transistor 94 is electrically coupled through the output-side impedance matching circuit to the output terminal of die 38. The source of transistor 94 is electrically coupled to a patterned metal layer on a bottom surface of die 38, and the bottom patterned metal layer is physically, electrically, and thermally coupled to the exposed top surface of a thermal dissipation structure 46. The output terminal of driver-stage die 38 is electrically coupled to the input terminal of final-stage die 40 through a wirebond array (not numbered) or another type of electrical connection. Final-stage die 40 also includes a plurality of integrated circuits. In an embodiment, the integrated circuitry of die 40 includes a series-coupled arrangement of an input terminal (not numbered), a GaN power transistor 96, and an output terminal 120. More specifically, the gate of transistor 96 is electrically coupled to the input terminal of die 40, and the drain of transistor 96 is electrically coupled to output terminal 120 of die 40. The source of transistor 96 is electrically coupled to a patterned metal layer on a bottom surface of die 40, and the bottom patterned metal layer is physically, electrically, and thermally coupled to the exposed top surface of a thermal dissipation structure.

To ensure proper Doherty operation, the carrier amplifier may be biased to operate in a class AB mode, and the peaking amplifier may be biased to operate in a class C mode. To accomplish this biasing, a plurality of gate and drain bias voltages may be provided by external bias voltage sources. In embodiments, the bias voltages are provided through the bias terminals and interposer ring 42. Specifically, gate bias voltages for driver-stage transistors 90, 94 may be provided through driver gate bias terminals, drain bias voltages for driver-stage transistors 90, 94 may be provided through driver drain bias terminals, and gate bias voltages for final-stage transistors 92, 96 may be provided through gate bias terminals. Each of the terminals has a proximal end coupled to conductive structures (e.g., pads and traces) of patterned metal layer 68, and the conductive structures are electrically coupled (e.g., through wirebonds, as shown) to bias pads on the driver- and final-stage dies. In the illustrated embodiment, the gate and drain bias pads for both driver- and final-stage transistors 90, 92, 94, 96 are located on driver-stage dies 34, 38, and the gate bias voltage for final-stage dies 36, 40 "hops" from driver-stage dies 34, 38 to final-stage dies 36, 40 through wirebond connections, as shown. Returning again to the operation of PAM 20, an amplified carrier signal is produced at output terminal 122 of final-stage die 36, and an amplified peaking signal is produced at output terminal 120 of final-stage die 40, which also functions as combining node 104 for the amplifier. According to an embodiment, output terminal 122 of carrier final-stage die 36 is electrically coupled (e.g., through wirebonds (not numbered) or another type of electrical connection) to a first end of the phase shift and impedance inversion element 118, and output terminal 120 of peaking final-stage die 40 is electrically coupled (e.g., through wirebonds or another interconnect feature) to a second end of the phase shift and impedance inversion element 118.

Embodiments of a PCB utilized within a power amplifier system have also been disclosed. The PCB may include a PCB frontside on which a PAM mount region is provided; a PCB backside located opposite the PCB frontside, as taken in a PCB thickness direction; an RF input bondpad located on the PCB frontside and within an outer peripheral portion of the module mount region; an RF output bondpad located on the PCB frontside and within an outer peripheral portion of the module mount region; and an EBG isolation structure comprising an EBG cell array comprising a first grounded EBG cell array at least a portion of which is located within or beneath the PAM mount region. In at least some implementations, the PCB further includes: (i) an uppermost patterned metal layer in which the EBG cell array is formed; (ii) a ground plane formed within the PCB at a location beneath the first grounded EBG cell array; and (iii) EBG vias extending from the first grounded EBG cell array, away from the PAM, and to the ground plane to electrically ground the patterned EBG cells. At least a portion of the EBG cell array may be located between the RF input pad and the RF output bondpad, as taken along an axis perpendicular to PCB thickness direction. Additionally or alternatively, the PCB may also include a first row of bondpads located on the PCB frontside and flanking a first side of the EBG cell array, the RF input bondpad included in the first row of bondpads; as well as a second row of bondpads further located on the PCB frontside and flanking a second, opposing side of the EBG cell array, the RF output bondpad included in the second row of bondpads. Lastly, in at least some implementations in which the module mount region has a first surface area ($SA_{MR}$), while the first grounded EBG cell array spans a second surface area of the PCB frontside ($SA_{EBG}$), the following equation may apply: $SA_{MR}>SA_{EBG}>0.5\ (SA_{MR})$.

In the example embodiment of FIGS. 1-4, an EBG isolation structure 16 is integrated into module substrate 32, with a relatively compact or localized EBG cell array 18 formed in the uppermost patterned metal layer of module substrate 32 at a location between peaking amplification section 102 and carrier amplification section 100. In addition to grounded EBG cell array 18, EBG isolation structure 16 also includes a number of electrically-conductive EBG vias, which are represented by small circles within EBG cells 18 in the schematic of FIG. 1 (mimicking via-in-pad structures). The EBG vias extend within module substrate 32 in a direction away from populated frontside surface 50 to electrically couple each individual EBG cell 18 to a ground plane further contained in module substrate 32, such as internal ground plane layer 70 shown in FIG. 2. Two such grounded EBG cells 18 and corresponding EBG vias 126 are shown in phantom in FIG. 2 for illustrative purposes. The cells within grounded EBG cell array 18 are defined by a repeating geometric pattern, which is formed by patterning of the uppermost metal layer 68 of module substrate 32 such that EBG cell array 18 may be substantially coplanar with substrate frontside 50. In the present example, the EBG cells making-up grounded EBG cell array 18 are imparted with square-shaped planform geometries or topologies, which cooperate with the corresponding EBG vias 126 to form three dimensional mushroom-shaped or T-shaped structures extending upwardly from ground plane 70 toward frontside 50 of module substrate 32 and, more generally, toward topside surface 26 of PAM 20.

Figure 5:
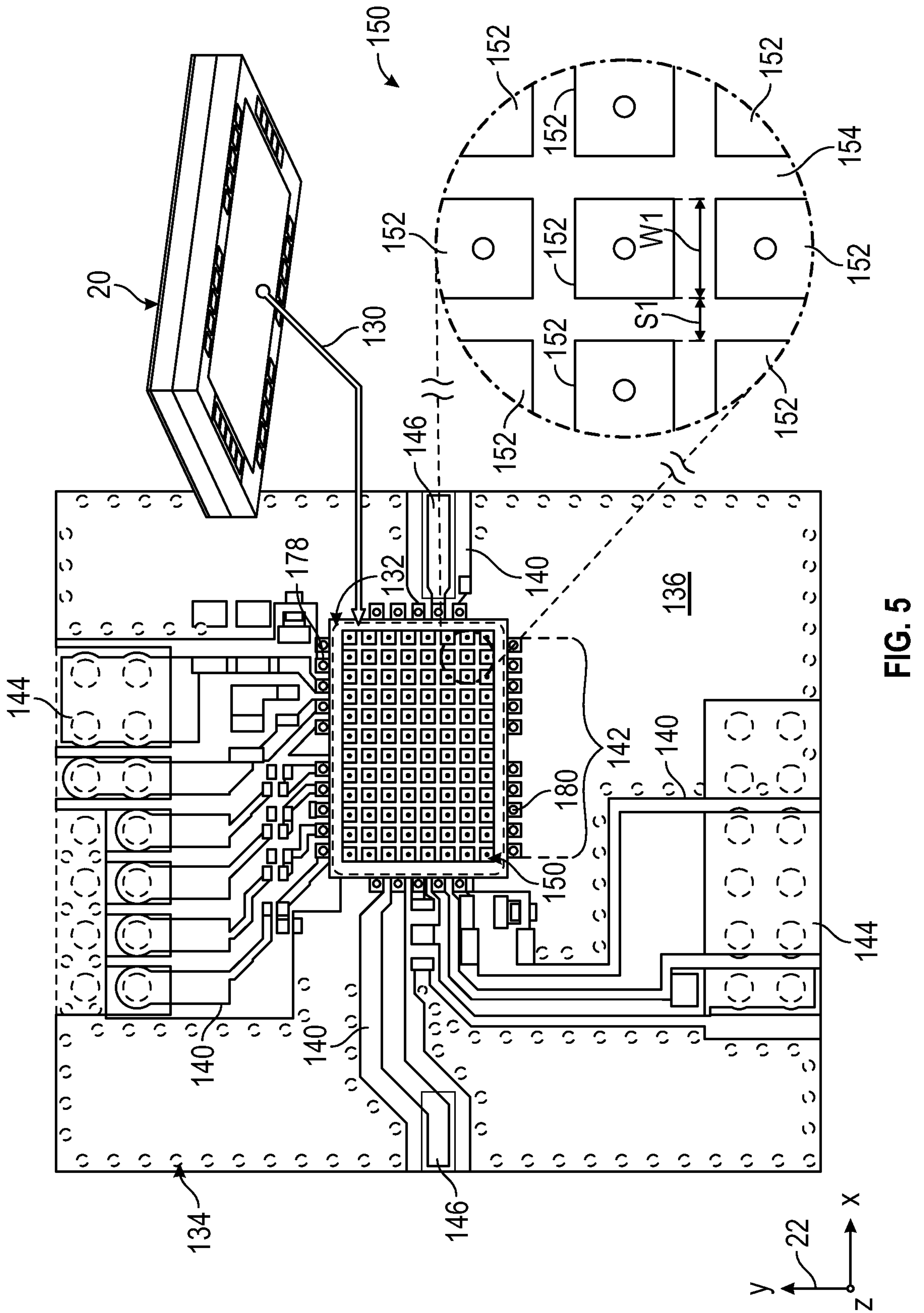
FIG. 5 is a top-down or planform view of a system-level printed circuit board (PCB) including an EBG isolation structure containing a grounded EBG cell array, which is distributed within a module mount region to which the example PAM shown in FIGS. 1-4 is attached, as illustrated in accordance with an example embodiment.
Figure 6:
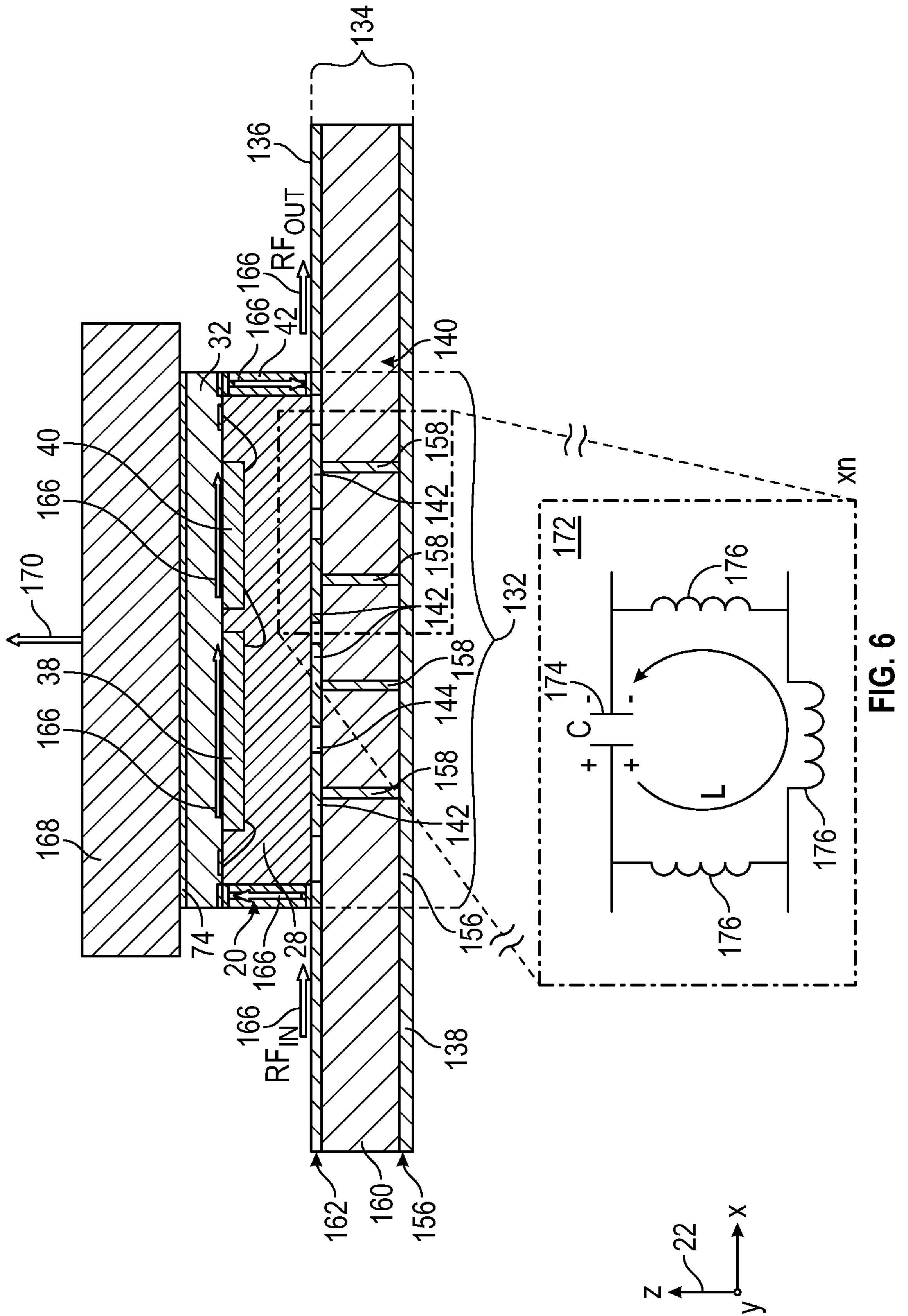
FIG. 6 is a simplified cross-sectional view of the PAM shown in FIGS. 1-4 and the system-level PCB shown in FIG. 5 illustrating one manner in which the PAM may be mounted to the PCB module mount region in an inverted orientation and further illustrating, in a lower detail window, a circuit equivalent of a portion of the EBG isolation structure.
Figure 7:
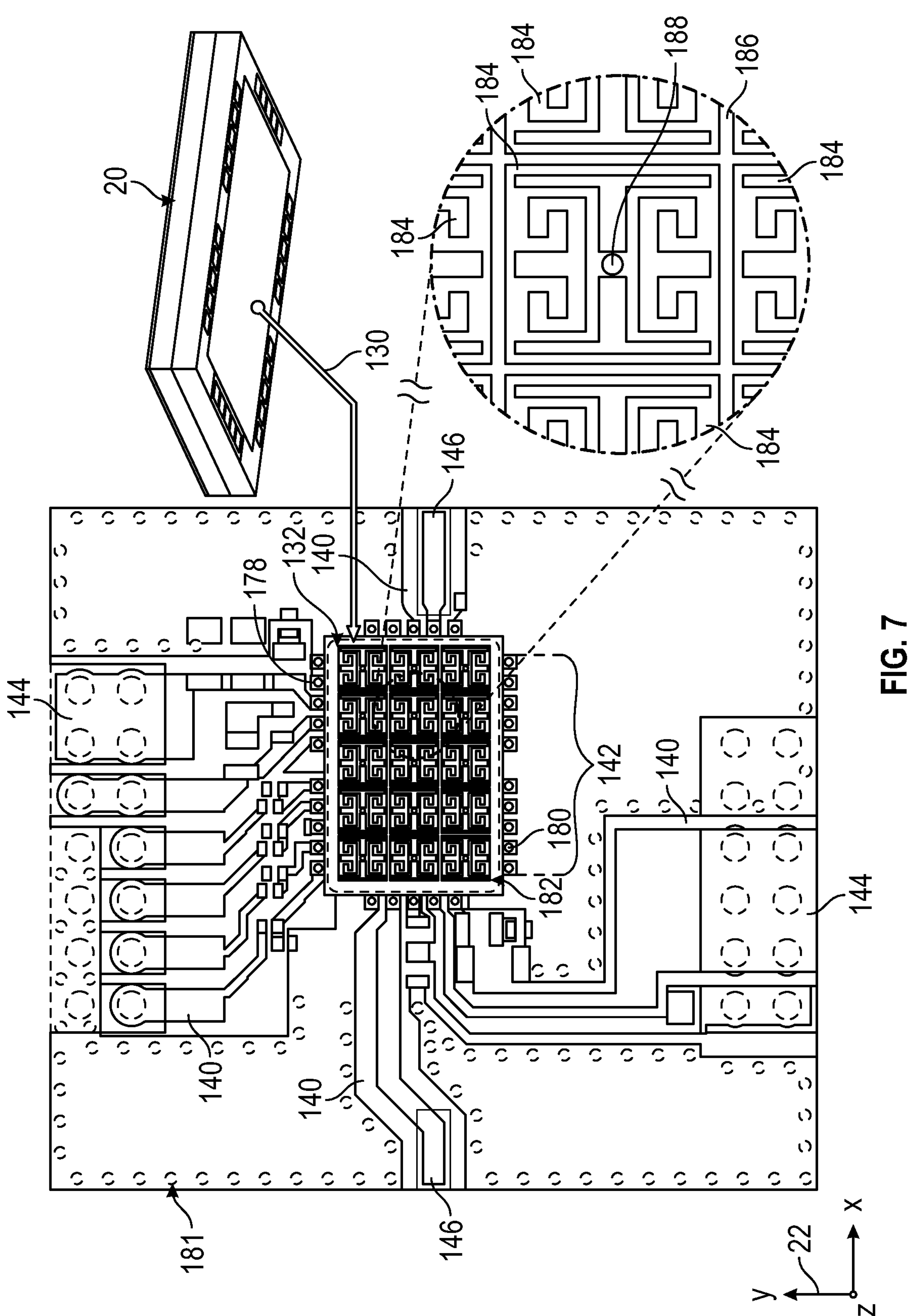
FIG. 7 is a planform view of a system-level PCB fabricated to include an integrated EBG isolation structure, which is similar to the EBG isolation structure shown in FIG. 5, but which contains a grounded EBG cell array having a more complex (split ring) topology.

In embodiments, EBG isolation structure 16 is advantageously tuned to provide nullify (e.g., peak attenuation of) stray EM energy emitted by electrically-active elements of PAM 20 when operated over its intended frequency range. EBG isolation structure 16 may be readily tuned through adjustments in the overall size and positioning of EBG cell array 18, through dimensional adjustments to the cell size of the individual cells within array 18, and to dimensional adjustments in the cell-to-cell spacing (and thus metal density) of EBG cell array 18. Further discussion in this regard is set-forth below in connection with an additional EBG isolation structure 150, which includes a second EBG cell array 152 integrated into a system-level substrate (PCB 134) to which PAM 20 may be mounted (FIGS. 5 and 6). At the present juncture, however, it may be noted that the grounded EBG cell array 18 (FIGS. 1 and 2) cooperates with EBG vias 126 (FIG. 2) to form an LC-like circuit structure, which can be tuned to shunt current generated due to resonance over a targeted frequency range to the EBG ground plane (here, ground plane layer 70). In so doing, grounded EBG cell array 18 and, more generally EBG isolation structure 16, collects and attenuates stray EM energy that may otherwise pass over the central region of module substrate 32 in which EBG cell array 18 is formed. This, in turn, may impede undesired cross-talk between the carrier and peaking RF signals transmitted through amplifier sections 100, 102. Through the integration of EBG cell array 18 and isolation structure 16 into module substrate 32 at location between the peaking and carrier amplifier signal paths (and, more generally, between the respective mount locations of dies 34, 38), the susceptibility of PAM 20 to such EM interface is reduced, if not eliminated to optimize PAM electrical performance. Such benefits may be achieved while confining the envelope of EBG isolation structure 16 to a relatively targeted or limited region of module substrate 32 (or perhaps multiple substrate regions) Additionally, EBG isolation structure 16 may be integrated into module substrate 32 in a cost effective manner consider, for example, that isolation structure 16 is amenable to production utilizing conventional PCB fabrication and metal patterning (e.g., lithography and plating) techniques.

Advancing now to FIGS. 5 and 6, there is shown a system-level substrate or PCB 134 to which a PAM may be mounted, as illustrated in accordance with an example embodiment of the present disclosure. For consistency with the foregoing description, system-level PCB 134 is described below in connection with HTP PAM 20 discussed above in connection with FIGS. 1-4. This notwithstanding PCB 134 can readily be utilized to support and interconnect other PAMs, which may not or may not possess an HTP architecture; that is, a topside I/O interface and an opposing bottomside thermal interface. System-level PCB 134 includes a first principal surface or frontside 136 and a second principal surface or backside 138, which are opposed in a thickness direction (corresponding to the Z-axis of coordinate legend 22). In the illustrated example in which PAM 20 is imparted with an HTP architecture including a topside I/O interface 24, PAM 20 is attached to a module mount region 132 of PCB 134 in an inverted orientation, as generally indicated by arrow 130 in FIG. 5 and as shown in the cross-section of FIG. 6. When so mounted, PAM 20 may be physically attached to module mount region 132 utilizing any suitable bonding material providing electrical connection between the topside terminals of PAM 20 and the corresponding contacts or bondpads of PCB 134. A non-exhaustive list of such bonding materials includes solder, sintered materials, and electrically-conductive die attach materials, such as metal particle-containing epoxies. Various routing features 140 (e.g., patterned Cu traces or interconnect lines) extend along PCB frontside 136 to interconnect PCB bondpads 142 with RF I/O contact regions 144 (located adjacent a first set of opposing edge regions of PCB 134) and pin terminal contact regions 146 (located adjacent a second set of opposing edge regions of PCB 134), which provide connection to other, non-illustrated electrical connectors (e.g., coaxial and pin connectors) within the larger power amplifier system.

An EBG isolation structure 150 is integrated into system-level PCB 134 and includes, among other features, a grounded array of EBG cells 152 distributed within a central portion of module mount region 132 of PCB 134. Adjacent or neighboring cells within EBG cell array 152 are spaced by lateral isolation gaps 154, as shown in a detail bubble appearing on the right side of FIG. 5. Isolation gaps 154 may be filled by a dielectric material or, instead, may be left as unfilled airgaps enclosed or covered when PAM 20 is mounted to PCB 134. In either instance, the combination of isolation gaps 154 and neighboring electrically-conductive cells within EBG cell array 152 form capacitive elements, which cooperate with the other electrically-conductive features of EBG structure 150 to provide the desired EM shielding or attenuation functionality, as described below in connection with the circuit schematic 172 shown in a lower portion of FIG. 6. The cells within EBG cell array 152, and other such EBG cell arrays, can be imparted with various repeating geometric patterns or topologies, ranging from relatively simple topologies (e.g., square or elongated rectangular shapes) to more complex topologies (e.g., spiral or square-wave shapes). As a further possibility, the cells within a given EBG cell array may be imparted with various other repeating geometries or patterns suitable for providing the desired EM attenuation effect through shunting of EM energy incident upon the EBG cell array to ground. This includes patterns based upon repeating fractal shapes (curves or geometric figures) of varying complexities or iterations, such as triangular Sierpinski shapes, curved Sierpinski shapes, and so-called Sierpinski "carpet" shapes similar, if not substantially identical to those encountered in fractal antenna designs. In at least some instances, such fractal geometries may enable the EBG cell array to target multiple frequencies for EM attention utilizing a single repeating pattern. In still other instances, certain cells within a given EBG cell array may be patterned, dimensioned, or both patterned and dimensions to provide peak EM attenuation at a first targeted frequency, while other cells within the EBG array are patterned and/or dimensioned to provide peak EM attenuation at a second targeted frequency (or, perhaps, multiple other frequencies). This latter an approach may be useful when it is desired to target disparate frequencies or to provide an increasingly broad-spectrum EM shielding or attenuation effect more fully encompassing the frequency range over which the power amplifier system operates.

The term "EBG cell," as appearing herein, refers to a repeating geometric shape formed in a patterned metal layer and which combines with other repeating shapes to yield an EBG cell array; e.g., the relatively localized EBG cell array 18 shown in FIGS. 1 and 2 or the larger EBG cell array 152 shown in FIGS. 5 and 6. The EBG cell array, by comparison, is a defined as a collection or grouping of EBG cells, which will often be implemented or formed in a common metal layer, such as the upper patterned metal layer of PCB 134. In various embodiments, the EBG cells of a given EBG cell array may be geometrically arranged or spatially distributed in 1-N rows and 1-M columns (where either N or M is greater than one), and without intervening conductive elements between the EBG cells in the array to define isolation gaps 154 (left as unfilled voids or filled with a dielectric PCB material). In other embodiments, the cells within a given EBG cell array may be distributed in a different spatial arrangement and can include, for example, two or more different cells shapes or patterns, which may be interspersed or spatially arranged in some manner. Finally, as appearing throughout this document, the term "grounded" refers to an element or structure subject to electrical grounding, by design, during operation of a given PAM, a PCB (e.g., motherboard) to which a given PAM is mounted or intended to be mounted, or a power amplifier system of the type described herein. Accordingly, the term "grounded EBG cell array," as appearing throughout this document, refers to an EBG cell array that is electrically grounded (or electrically groundable) by connection to a ground reference during operation of a power amplifier system in which the PAM is ultimately installed.

In embodiments of EBG isolation structure 150, the cells within EBG cell array 152 can be imparted with a wide range of geometric shapes or topologies, which may include a single repeating pattern or, perhaps, multiple interspersed patterns. In the example embodiment shown in FIGS. 5 and 6, the cells of EBG cell array 152 are imparted with square planform geometries, each having a width identified by double-headed arrow $W_1$ (FIG. 5) and separated by a cell-to-cell spacing identified by double-headed arrow S1 (FIG. 5). EBG isolation structure 150 also includes at least one ground plane 156 (FIG. 6) and column-like vertical electrical connections or "EBG vias 158." Ground plane 156 is located on backside 138 of PCB 134 in the illustrated example, but may be internal to PCB 134 in further implementations. EBG vias 158 within dielectric body 160 of PCB 134 from EBG cell array 152 to ground plane 156 in a direction away from module mount region 132 and PAM 20 (when attached to PCB 134). In at least some embodiments, grounded EBG cell array 152 may be formed in uppermost patterned metal layer 162 of PCB 134 such EBG cell array 152 is located adjacent, and extends parallel to, topside surface 26 of PAM 20 when attached to system-level PCB 134. In other implementations, grounded EBG cell array 152 may be formed at a lower, internal level in PCB 134, such as in the next patterned metal level located beneath the uppermost patterned metal layer 162 and above the lowermost metal layer 164 of PCB 134, while having a planform or horizontal positioning identical or similar to that shown in FIGS. 5 and 6.

PAM 20 is mounted or attached to frontside 136 of PCB 134 in an inverted orientation in the illustrated example in which PAM 20 is imparted with an HTP architecture. Due to this inverted mounting, PAM topside surface 26 is positioned adjacent and faces module mount region 132 in which EBG cell array 152 is formed. When PAM 20 is properly mounted to PCB frontside 136, RF input terminal 76 and RF output terminal 78 included in topside I/O terminals 24 of PAM 20 are electrically coupled to corresponding terminals or bondpads located on PCB frontside 136; namely, an RF input bondpad 178 and an RF output bondpad 180 (identified in FIG. 5), which are included in opposing bondpad rows 142 flaking opposing edges of EBG cell array 152. PAM 20 is consequently positioned over and vertically adjacent EBG cell array 152, and may be substantially concentric with cell array 152 in embodiments, with the centerline of module mount region 132 (represented in FIG. 6 by arrow 170) extending through EBG cell array 152. Further, the PAM topside surface may cover the EBG cell array 152, in whole or in part, as viewed looking downwardly on PCB 134 along centerline 170 after attachment of PAM 20 to module mount region 132. Finally, when an EGB cell array (e.g., EGB cell array 18 shown in FIGS. 1 and 2) is integrated into module substrate 32, while an EGB cell array (e.g., EGB cell array 152 shown in FIGS. 1 and 2) is integrated into PCB 134, the EGB cell arrays may overlap vertically or as taken in a thickness direction. Stated differently, in such embodiments, an axis orthogonal to PCB frontside 136 and corresponding to the Z-axis of coordinate legend 22 may intersect both the EBG cell array 18 within PAM 20 and EGB cell array 152 integrated into system-level PCB 134.

As shown most clearly in FIG. 5, RF input bondpad 178 and RF output bondpad 180 are contained within opposing PCB bondpad I/O rows, which are located adjacent and flank opposing sides of grounded EBG cell array 152. Due to this spatial configuration, RF signals transmitted through PAM 20 may be conducted along the following general signal transmission path or paths, as indicated by arrows 166 in FIG. 6. First, an RF signal (e.g., an amplified RF signal not yet split into carrier and peaking fractions) may be received at RF input terminal 76 of PAM 20 and be conducted through a first interposer via formed in a first interposer piece or region in a direction away from PCB 134 and toward module substrate 32, as indicated on the left side of FIG. 6. The RF signal may then be transmitted through amplifier dies 38, 40, thus undergoing signal amplification and traveling over grounded EBG cell array 152 as viewed along a section plane orthogonal to grounded EBG array 142 such as that shown in FIG. 6. Following this, the newly-amplified RF signal is transmitted through the second interposer via formed in a second interposer piece or region in a direction away from module substrate 32 and toward system-level PCB 134 to the RF output terminal of PAM 20. Accordingly, viewing PAM 20 and system-level PCB 134 from the cross-section of FIG. 6, the RF signal is effectively transmitted up and over the grounded EBG cell array 152 formed in the uppermost patterned metal layer 162 of PCB 134 and located within module mount region 132. Additionally, wirebonds within PAM 20 (when present) may project in a direction away from module substrate 32 and the packed dies, with the respective loop apexes of the wirebonds extending toward EBG cell array 152. Grounded EBG cell array 152 may consequently further assist in terminating or nullifying undesired EM energy radiated from the wirebonds in embodiments depending upon, for example, the proximity between the wirebond apexes and EBG cell array 152.

The circuit equivalent of the repeating electrically-conductive structures or features of grounded EBG cell array 152 is shown in a detail window 172, appearing in a lower portion FIG. 6. As indicated in detail window 172, a capacitance 174 is created by adjacent cells contained within EBG cell array 152 and separated by isolation gaps 154, which may be left as unfilled airgaps or filled with a dielectric material, as previously noted. EBG vias 176 and ground plane 156 itself provide electrically-inductive elements, which cooperate with capacitance 174 to form multiple instances of an LC circuit coupled to ground. The resulting LC circuit thus provides, in essence, a shunt capacitance for diverting stray or problematic EM energy generated due to resonation at a targeted frequency to electrical ground through PCB ground plane 156. By varying the inductance and capacitance values of the inductive element and the capacitive element, the illustrated circuit can be tuned to resonate at a targeted harmonic frequency or frequency range to terminate stray EM energy radiated by conductive elements within the power amplifier system at this frequency. The capacitive values, in particular, can be varied through adjustments in the spacing and size of the EBG cells included in grounded EBG cell array 152; and, specifically, by adjusting the respective widths (double-headed arrow W1, FIG. 5) and cell-to-cell spacing (double-headed arrow S1, FIG. 5) of the grounded EBG cells by patterning the uppermost metal layer of PCB 134 to define grounded EBG cell array 152 having the desired dimensions. So too can the frequency at which EBG isolation structure 150 provides peak attenuation of undesired or stray EM energy transmitted across a region of space encompassing module mount region 132 through dimensional changes in the other features of EBG isolation structure 150 (e.g., EBG vias 158 and ground plane 156) or changes in the materials from which these features are produced. Generally, then, the repeating EBG cell pattern (and the other features of isolation structure 150) can be structurally configured (dimensioned and spaced) to provide peak attenuation of electromagnetic energy over the operational frequency range of the power amplifier system containing PAM 20 and PCB 134. Such tuning parameters can also be adjusted in the context of EBG isolation structure 16 and EBG cell array 18 (FIGS. 1 and 2) when integrated into module substrate 32 of PAM 20.

In the above-described manner, the integration of EBG isolation structure 16 into module substrate 32 and/or the integration of EBG isolation structure 150 into system-level PCB 134 may favorably reduce or eliminate EM coupling otherwise potentially occur within the power amplifier system. In the case of EBG isolation structure 150, in particular, grounded EBG cell array 152 may provide relatively comprehensive shielding between the RF input (or inputs) and RF output (or outputs) of PCB 134 and PAM 20 to reduce, if not eliminate input-output coupling at the PAM-PCB interface. Further, EBG isolation structure 150 can be readily integrated into system-level PCB 134 at minimal cost and modification through conventional PCB fabrication and metal layer pattering techniques; noting that, in many conventional PCB designs, the central portion of the module mount is commonly left as an unused space lacking electrical routing features or is otherwise simply covered by a continuous ground plane. When contained with PAM 20, EBG isolation structure 16 may likewise be integrated into module substrate 32 in a relatively straightforward, cost-effective manner. Further, while space constraints are often a primary concern in module substrate design, the grounded EBG cell array or arrays (e.g., EBG cell array 18 shown in FIGS. 1 and 2) may provide appreciable EM shielding even when localized, while deployed at strategically-selected locations between disparate signal paths, such as carrier and peaking amplification paths. As a still further advantage, the presently-disclosed EBG isolations structures are well-suited for usage within PAMs having HTP architectures enhancing PAM electrical and thermal performance. In this final regard, and referring briefly once again to FIG. 6, PAM 20 may be mounted to PCB 134 in an inverted orientation to avail the backside thermal interface of PAM 20 (here, backmetal layer 74) for thermal coupling to a system-level heatsink 168, such as a pin-fin array or a metal chassis, utilizing a thermally-conductive bonding material. Excess heat generated within the interior of PAM 20 due to the operation of the packaged IC dies (e.g., the carrier die or dies) can be efficiently conducted from the packaged dies, through module substrate 32 (e.g., due to the provision of heat dissipation structures 46 shown in FIGS. 1 and 2), through backmetal layer 74, and ultimately to system-level heatsink 168 for dissipation to the surrounding environment.

Additional Examples of EBG Isolation Structures Integrated into a Module Substrate and a System-Level PCB Example system-level PCBs and module substrate contained within PAMs, which include EBG isolation structures featuring grounded EBG cell arrays, have thus been described in connection with FIGS. 1-7. In the above-described examples, the cells contained within the EBG cell arrays are imparted with relatively simple, square-shaped planform geometries, which cooperate with the EBG vias to form mushroom-shaped structures extending from a ground plane (e.g., toward the module mount region), as viewed along a section plane orthogonal to the EBG cell array. As emphasized above, alternative embodiments of the EBG isolation structure may include EBG cell arrays having various other planform geometries or repeating geometric patterns, including fractal shapes of varying complexities, to provide the desired attenuation effect reducing the susceptibility of the power amplifier system to undesired EM coupling or cross-talk. To further illustrate this point, an additional example of an EBG isolation system integrated into a system-level PCB 181 and having a more complex EBG cell topology is further shown in FIG. 7. In many respects, PCB 181 is similar to PCB 134 shown in FIG. 5, with like reference numerals have been carried forward to denote like structural elements. For example, as does PCB 134 (FIG. 5), PCB 181 includes an integrated EBG isolation structure 182 including an array of grounded EBG cells 184, which are separated by isolation gaps 186. EBG vias 188 (one of which is labeled in the detail bubble shown on the right of FIG. 7) are further formed in PCB 181 and extend from a central portion of each individual EB cell 184 to tie the cell to a non-illustrated ground plane further contained in PCB 181. A circuit structure is thus created analogous to that described above in connection with detail bubble 172 shown in FIG. 6 to shunt excess or stray EM energy otherwise potentially transmitted between opposing rows of bond pads (and, thus, between RF input and output 178, 180) to ground at a resonant frequency. In contrast to EBG cell array 152 of isolation structure 160 integrated into PCB 134 (FIG. 5), however, the cells of EBG cell array 184 have a more complex, split ring or spiral geometry. Such a split ring geometry or topology may enable further fine-tuning of capacitive and inductive circuit elements provided by EBG cell array 184 through the dimensioning and shaping of the illustrated split ring topology or other, similar spiral-shaped topologies. This, in turn, may allow grounded EBG cell array 184 and, more generally, EBG isolation structure 182 to provide an enhanced, increasingly-optimized EM shielding effect, potentially while allowing a reduction in the overall planform area occupied by EBG cell array 184.

Figure 8:
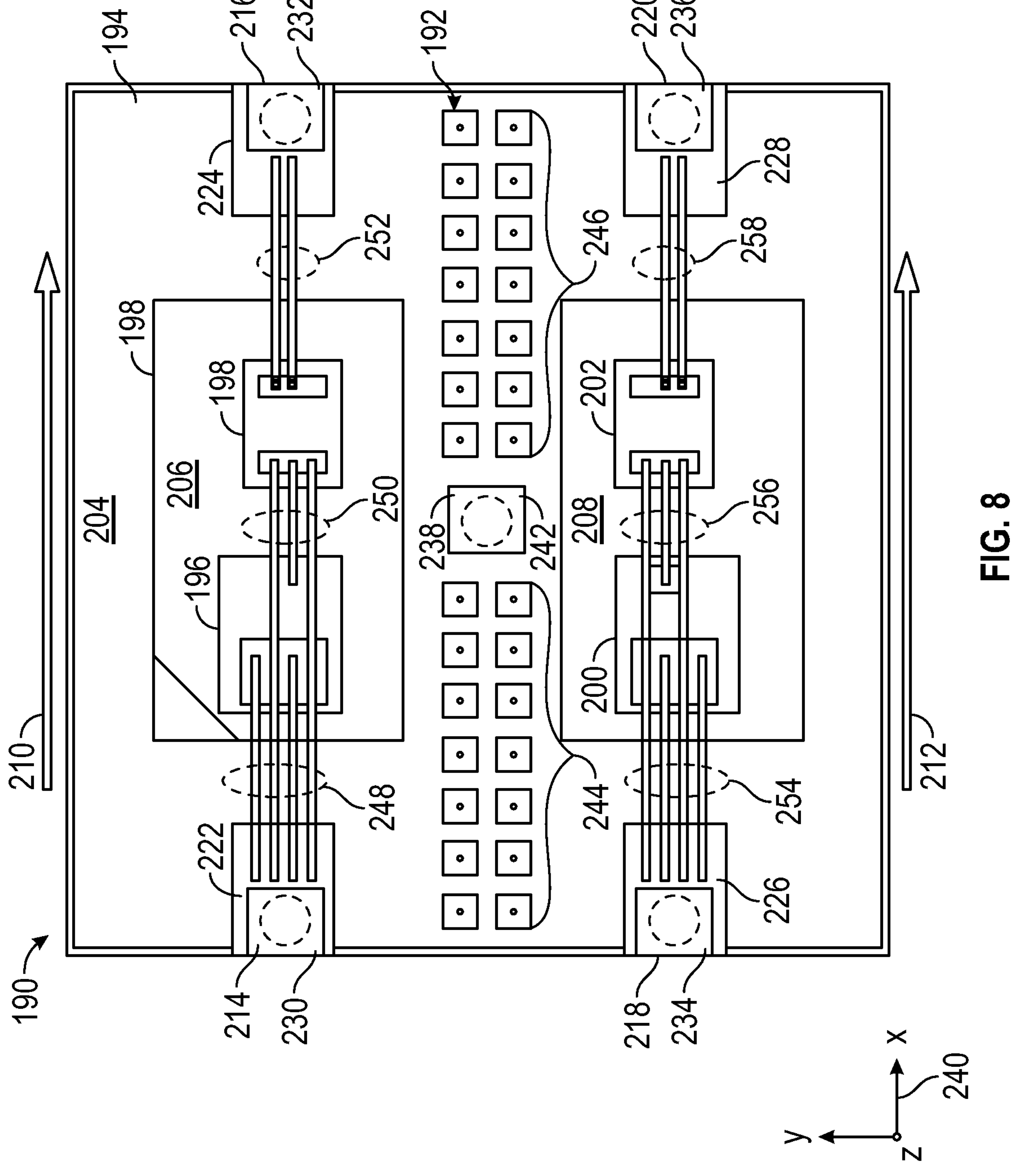
FIG. 8 is planform view of the frontside of a PAM shown prior to encapsulation and including an EBG isolation structure integrated into the module substrate at a location between carrier and peaking signal amplification paths within the PAM, as illustrated in accordance with a further example embodiment of the present disclosure.

Addressing lastly FIG. 8, an example PAM 190 shown prior to encapsulation and including an EBG isolation structure 192 integrated into a module substrate 194, as illustrated in accordance with a further embodiment of the present disclosure. A number of IC dies 196, 198, 200, 202 is contained in PAM 190 and attached to a frontside or die support surface 204 of module substrate 194. Specifically, IC dies 196, 198 may be mounted to a first heat dissipation structure (e.g., a Cu coin) 206 embedded in module substrate 194, while IC dies 200, 202 may be mounted to a second heat dissipation structure (e.g., a Cu coin) 208 further embedded in substrate 194 In the illustrated example, PAM 190 is imparted with a Doherty amplifier architecture. Accordingly, IC dies 196, 198, 200, 202 may assume the form of: (i) a first IC die 196 bearing a carrier-side input matching network (herein, "$MN_{CS}$ die 196"); (ii) a second IC die 200 bearing a peaking-side input matching network (herein, "$MN_{PS}$ die 200"); (iii) a third IC die 198 bearing a carrier amplifier IC (herein, "carrier RF power die 198"); and (iv) a fourth IC die 200 bearing a peaking amplifier IC (herein, "peaking RF power die 200"). $MN_{CS}$ die 196 and carrier RF power die 198 are positioned in a carrier signal amplification path, which extends through PAM 190 and which is represented by a first arrow 210 shown in an upper portion of FIG. 8. Conversely, $MN_{PS}$ die 200 and peaking RF power die 200 are positioned in a carrier signal amplification path, which likewise extends through PAM 190 and which is represented by a second arrow 210 shown in a lower portion of FIG. 8.

Several interposer pieces 214, 216, 218, 220 are bonded to corresponding bondpads 222, 224, 226, 228 formed in frontside 204 of module substrate 194. Interposer pieces 214, 216, 218, 220 project upwardly from module substrate 194 in a module height or thickness direction (corresponding to the Z-axis of coordinate legend 240). Interposer pieces 214, 216, 218, 220 may each be elongated in a module thickness direction and are imparted with a sufficient height to extend from module substrate 194 to the PAM topside surface. As previously indicated, outer terminal surfaces of the upper metallic layers or "upper interposer pads" included in interposer pieces 214, 216, 218, 220 may be exposed along the PAM topside surface to partially define a topside I/O interface 230, 232, 234, 236, 242 of PAM 190. In particular, an upper interposer pad of interposer piece 214 may be exposed through the PAM topside surface to define a topside carrier input terminal 230; an upper interposer pad of interposer piece 216 is exposed through the PAM topside surface to define a topside carrier output terminal 232; upper interposer pad of interposer piece 218 is exposed through the PAM topside surface to define a topside peaking input terminal 234; and an upper interposer pad of interposer piece 220 is exposed through the PAM topside surface to define a topside peaking output terminal 236. Additionally, a fifth interposer piece 238 is coupled to a central portion of module substrate 194 and extends upwardly therefrom in a module height or thickness direction (corresponding to the Z-axis of coordinate legend 240). Interposer piece 238 has an upper patterned metal layer defining an upper interposer pad 242, which serves as a ground terminal included in topside I/O interface 230, 232, 234, 236, 242. In this example, interposer piece 238 is centrally located or position to allow an EBG cell array 244, 246 included in EBG isolation structure 192 to extend to the opposing edges of module substrate 194 and between the respective pairs of RF input terminals and RF output terminals, as further discussed below.

Various sets of wirebonds 248, 250, 252, 254, 256, 258 provide electrical interconnections within PAM 190. For example, and referring initially to the carrier signal amplification side of PAM 190, a first set of wirebonds 248 electrically couples substrate bondpad 222 to an input pad of $MN_{CS}$ die 196; a second set of wirebonds 250 electrically couples input and output pads of $MN_{CS}$ die 196 to an input pad of carrier RF power die 198; and a third set of wirebonds 252 electrically couples the output pad of carrier RF power die 198 to substrate bondpad 224. Similarly, referring to the peaking signal amplification side of PAM 190, a fourth set of wirebonds 254 electrically couples substrate bondpad 226 to an input pad of $MN_{PS}$ die 200; a fourth set of wirebonds 256 electrically couples input and output pads of $MN_{PS}$ die 200 to an input pad of peaking RF power die 200; and a sixth set of wirebonds 258 electrically couples the output pad of peaking RF power die 200 to substrate bondpad 228. In this manner, an electrically-conductive carrier signal amplification path (arrow 210, FIG. 8) is formed extending from topside terminal 230, through interposer piece 214, through substrate bondpad 222, and ultimately to carrier RF power die 198; and, from carrier RF power die 198, through substrate bondpad 224, through interposer piece 216, and to topside terminal 232. In a similar regard, an electrically-conductive peaking signal amplification path (arrow 212, FIG. 8) is formed extending from topside terminal 234, through interposer piece 218, through substrate bondpad 226, and ultimately to peaking RF power die 200; and, from peaking RF power die 200, through substrate bondpad 228, through interposer piece 220, and to topside terminal 236.

EBG structure 192 is similar to EBG structure 16 described above in connection with FIGS. 1 and 2. As was previously the case, EBG structure 192 includes a grounded EBG cell array 244, 246, which, in this example, is arranged as a band or strip extending from a first edge of PAM 190 along which RF inputs 230, 234 are provided to a second, opposing edge of PAM 190 along which RF outputs 232, 236 are provided. The cells within EBG cell array 244, 246 are grounded by vias (represented by small circles in FIG. 8), which extend into the body or thickness of module substrate 194 in a direction away from the substrate frontside 204 and to a non-illustrated ground plane further formed within or on the backside of module substrate 194. The EBG cells within array 244, 246 are again patterned to have a relatively simple, repeating geometry, but may alternatively be provided with more complex topologies in other implementations. When viewed in cross-section along a section orthogonal to EBG cell array 244, 246, the EBG cells, vias, and ground plane may again have mushroom-shaped geometries and provide the desired EM shielding or termination function described throughout this document. Further, EBG cell array 244, 246 is elongated along its length and may extend a majority, if not the substantial entirety of the length of PAM 190, as measured in the module length direction (corresponding to the X-axis of coordinate legend 240). Accordingly, EBG cell array 244, 246 may extend from a first location adjacent a first sidewall of PAM 190; between interposer pieces 214, 218; across a central portion of module substrate 194; between interposer pieces 216, 220; and to a second opposing sidewall of PAM 200. Given its positioning EBG cell array 244, 246 provides in-module EM shielding between the across the substantial entirety of signal amplification paths to optimize RF performance by eliminating or minimizing cross-talk or undesired EM coupling between the peaking and carrier amplificant paths of PAM 20. In still other implementations, such an EBG cell array 244, 246 may be formed in an internal layer of module substrate 194; or formed in an interposer piece (e.g., an elongated rectangular interposer piece also providing the desired ground contacts included in the topside I/O interface of PAM 20) bonded to frontside 204 of PAM 190 in a manner akin to interposer pieces 214, 216, 218, 220.

CONCLUSION

There has thus been described PAMs and system-level PCBs included in power amplifier systems, which contain unique EBG isolation structures improving electrical performance aspects of the amplifier system through targeted EM shielding. Embodiments of the above-described PAMs and system-level PCBs incorporate EBG arrays, as included in the larger EBG isolation structures, into certain selected at which undesired cross-coupling may occur absent the provision of the EBG isolation structures. Such locations may include the locations within or immediately adjacent (e.g., positioned beneath) the module mount region on the system-level PCB, such within a central portion of the module mount region and adjacent one or more rows of I/O bondpads when the EBG cell array is formed on the system-level PCB. Additionally or alternatively, an EBG isolation structure may be incorporated into a PAM by, for example, integration of the EBG cell array into the module substrate at locations separating RF input and/or output pads of the module substrate, at locations separating peaking and carrier amplification paths of the PAM (when having a Doherty amplifier layout, or a combination thereof. Embodiments of the presently-disclosed power amplifier systems are advantageously compatible with PAMs having HTP architectures or builds in which the PAM is furnished with topside I/O interface, which is mechanically and electrically coupled to corresponding contacts on the system-level PCB when the PAM is mounted thereto in an inverted orientation; as well as a backside thermal interface, which may be placed in thermal contact with a system-level heatsink to enhance the heat dissipation capabilities of the PAM. The end result is PAMs and power amplifier systems having improved electrical performance characteristics and, in many instances, improved thermal performance characteristics relative to conventional power amplifier systems lacking the features disclosed herein.

In embodiments, the power amplifier system includes a PCB and a PAM mounted to the PCB in an inverted orientation. The PCB has a PCB frontside on which a PAM mount region is provided, a RF input bondpad (e.g., located on the PCB frontside), and an RF output bondpad (e.g., located on the PCB frontside). The PAM includes a topside I/O interface having RF input and output terminals electrically coupled to the RF input and output pads, respectively. The power amplifier system further includes a first EBG isolation structure containing a first grounded EBG cell array, at least a portion of which is located within or beneath the PAM mount region. In certain cases, the PCB may include an uppermost patterned metal layer in which the first grounded EBG cell array is formed. Additionally, the first EBG cell array may contain a repeating pattern of EBG cells, which are separated by air gaps located immediately beneath the PAM. In other implementations, at least a portion of the first grounded EBG cell array is located between the RF input pad and the RF output bondpad, as taken along an axis perpendicular to PCB thickness direction. Embodiments of the power amplifier system may further include: (i) a first row of bondpads located on the PCB frontside and flanking a first side of the first grounded EBG cell array, the RF input bondpad included in the first row of bondpads; and (ii) a second row of bondpads further located on the PCB frontside and flanking a second, opposing side of the first grounded EBG cell array, the RF output bondpad included in the second row of bondpads. As a still further possibility, the EBG isolation structure may include a ground plane formed within the PCB at a location beneath the first grounded EBG cell array; as well as EBG vias extending from the first grounded EBG cell array, away from the PAM, and to the ground plane to electrically ground the patterned EBG cells during operation of the power amplifier system.

Embodiments of a PCB utilized within a power amplifier system have also been disclosed. The PCB may include a PCB frontside on which a PAM mount region is provided; a PCB backside located opposite the PCB frontside, as taken in a PCB thickness direction; an RF input bondpad located on the PCB frontside and within an outer peripheral portion of the module mount region; an RF output bondpad located on the PCB frontside and within an outer peripheral portion of the module mount region; and an EBG isolation structure comprising an EBG cell array comprising a first grounded EBG cell array at least a portion of which is located within or beneath the PAM mount region. In at least some implementations, the PCB further includes: (i) an uppermost patterned metal layer in which the EBG cell array is formed; (ii) a ground plane formed within the PCB at a location beneath the first grounded EBG cell array; and (iii) EBG vias extending from the first grounded EBG cell array, away from the PAM, and to the ground plane to electrically ground the patterned EBG cells. At least a portion of the EBG cell array may be located between the RF input pad and the RF output bondpad, as taken along an axis perpendicular to PCB thickness direction. Additionally or alternatively, the PCB may also include a first row of bondpads located on the PCB frontside and flanking a first side of the EBG cell array, the RF input bondpad included in the first row of bondpads; as well as a second row of bondpads further located on the PCB frontside and flanking a second, opposing side of the EBG cell array, the RF output bondpad included in the second row of bondpads. Lastly, in at least some implementations in which the module mount region has a first surface area ($SA_{MR}$), while the first grounded EBG cell array spans a second surface area of the PCB frontside ($S_{EBG}$), the following equation may apply: $SA_{MR}>S_{EBG}>0.5_{MR}$.

Embodiments of a PAM utilized within a power amplifier system have further been provided. In various realizations, the PAM includes a first power amplifier die, a module substrate having a die support surface to which the first power amplifier die is attached, and a molded body. The molded body is bonded to the die support surface, encapsulating the first power amplifier die, and at least partially defining a PAM topside surface. A topside I/O interface is formed on the PAM topside surface, while an EBG isolation structure integrated into the module substrate. The EBG isolation structure includes, in turn, an EBG cell array formed in die support surface at a location adjacent the first power amplifier die, a ground plane formed in the module substrate at a location beneath the EBG cell array, and EBG vias extending from the EBG cell array, away from the die support surface, and to the ground plane to electrically ground the EBG cell array during operation of the PAM. In at least some implementations, the first power amplifier die assumes the form of a peaking amplifier die, the PAM further includes a carrier amplifier die attached to the die support surface of the module substrate, and at least a portion of the EBG cell array is located between the first power amplifier die and the carrier amplifier die.

Power amplifier systems including power amplifier modules (PAMs) and electromagnetic bandgap (EBG) isolation structures are disclosed. In embodiments, the power amplifier system includes a printed circuit board (PCB) and a PAM mounted to the PCB in an inverted orientation. The PCB has a PCB frontside on which a PAM mount region is provided, and radio frequency (RF) input and output bondpads. The PAM includes a topside input/output interface having RF input and output terminals electrically coupled to the RF input and output pads, respectively. The power amplifier system further includes a first EBG isolation structure containing a first grounded EBG cell array, at least a portion of which is located within or beneath the PAM mount region.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

The invention claimed is:

1. A power amplifier system, comprising:

a printed circuit board (PCB), comprising:

an uppermost metal layer, a PCB frontside on which a module mount region is provided, a PCB backside located opposite the PCB frontside, as taken in a PCB thickness direction, a radio frequency (RF) input bondpad, an RF output bondpad, and an electromagnetic bandgap (EBG) isolation structure including a grounded EBG cell array located within the module mount region, wherein the grounded EBG cell array is patterned in the uppermost metal layer; and a power amplifier module (PAM) mounted to the PCB in an inverted orientation such that a topside surface of the PAM is positioned adjacent to, and faces, the module mount region, the PAM comprising a topside input/output (I/O) interface formed on the topside surface, the topside I/O interface including an RF input terminal electrically coupled to the RF input bondpad, and including an RF output terminal electrically coupled to the RF output bondpad.

2. The power amplifier system of claim 1, wherein the EBG cell array comprises a repeating pattern of EBG cells having a split ring geometry, the EBG cells separated by isolation gaps located immediately beneath the PAM.

3. The power amplifier system of claim 1, wherein at least a portion of the first grounded EBG cell array is located between the RF input bondpad and the RF output bondpad, as taken along an axis perpendicular to PCB thickness direction, and wherein the grounded EBG cell array is configured to reduce electromagnetic coupling between the RF input bondpad and the RF output bondpad.

4. The power amplifier system of claim 3, further comprising:

a first row of bondpads located on the PCB frontside and flanking a first side of the grounded EBG cell array, the RF input bondpad included in the first row of bondpads; and a second row of bondpads further located on the PCB frontside and flanking a second, opposing side of the grounded EBG cell array, the RF output bondpad included in the second row of bondpads, wherein the uppermost metal layer is patterned to define the first row of bondpads and the second row of bondpads, and wherein the first row of bondpads and the second row of bondpads are positioned around an outer periphery of the module mount region.

5. The power amplifier system of claim 3, wherein the EBG isolation structure further comprises:

a ground plane formed within the PCB at a location beneath the grounded EBG cell array; and EBG vias extending from the grounded EBG cell array, away from the PAM, and to the ground plane to electrically ground the grounded EBG cell array during operation of the power amplifier system.

6. The power amplifier system of claim 5, wherein power amplifier system has an operational frequency range of about 600 megahertz to about 10 gigahertz; and wherein the EBG cell array comprises a repeating pattern of EBG cells, which are dimensioned and spaced to provide peak attenuation of electromagnetic energy incident upon the EBG cell array over the operational frequency range of the power amplifier system.

7. The power amplifier system of claim 1, wherein the PAM further comprises a backside thermal interface opposite the topside surface, the backside thermal interface and the EBG array intersected by a common axis extending parallel to the PCB thickness direction.

8. The power amplifier system of claim 1, wherein the module mount region has a first surface area ($SA_{MR}$);

wherein the first grounded EBG cell array spans a second surface area of the PCB frontside ($SA_{EBG}$); and wherein $SA_{MR}>SA_{EBG}>0.5(SA_{MR})$.

9. The power amplifier system of claim 1, wherein the grounded EBG cell array is confined to a central portion of the module mount region.

10. The power amplifier system of claim 1, wherein the PAM comprises:

at least one power amplifier die;

a module substrate to which the at least one power amplifier die is attached; and at least one interposer piece bonded to an outer peripheral portion of the module substrate, the at least one interposer piece comprising:

a first interposer via through which the RF input terminal is electrically coupled to the at least one power amplifier die; and second interposer via through which the at least one power amplifier die is electrically coupled to the RF output terminal.

11. The power amplifier system of claim 10, wherein the grounded EBG cell array is positioned relative to the PAM such that, when an RF signal is supplied to the RF input terminal, the RF signal is transmitted (i) through the first interposer via in a direction away from the PCB, (ii) through the at least one power amplifier die and over the grounded EBG cell array, and (iii) through the second interposer via in a direction toward the PCB to the RF output terminal.

12. The power amplifier system of claim 1, wherein the PAM comprises:

a peaking amplifier die;

a carrier amplifier die;

a module substrate having a die support surface to which the peaking amplifier die and the carrier amplifier die are attached; and a PAM EBG isolation structure comprising a grounded PAM EBG cell array distributed along the die support surface of the module substrate, wherein the PAM EBG isolation structure is located between the peaking amplifier die and the carrier amplifier die.

13. The power amplifier system of claim 1, wherein the PAM has a Doherty amplifier layout including a carrier amplifier section and a peaking amplifier section, wherein the grounded EBG cell array is located between a carrier amplification signal path and a peaking amplification signal path, and wherein the grounded EBG cell array is tuned to provide targeted attenuation of EM energy generated over an operational frequency of the PAM by shunting stray EM energy incident upon the grounded EBG cell array to ground.

14. The power amplifier system of claim 12, wherein the PAM has a Doherty amplifier layout including a carrier amplifier section and a peaking amplifier section, wherein the PAM EBG cell array is integrated into the module substrate and located between a carrier amplification signal path and a peaking amplification signal path within the PAM, and wherein the PAM EBG cell array is tuned to provide targeted attenuation of EM energy generated over an operational frequency of the PAM by shunting stray EM energy incident upon the PAM EBG cell array to ground.

15. A printed circuit board (PCB) utilized within a power amplifier system, the PCB comprising:

a PCB frontside on which a module mount region is provided;

a PCB backside located opposite the PCB frontside, as taken in a PCB thickness direction;

a radio frequency (RF) input bondpad positioned on the PCB frontside and located within an outer peripheral portion of the module mount region;

an RF output bondpad positioned on the PCB frontside and located within the outer peripheral portion of the module mount region; and an electromagnetic bandgap (EBG) isolation structure comprising a grounded EBG cell array disposed within the module mount region and configured to reduce electromagnetic coupling between the RF input bondpad and the RF output bondpad.

16. The PCB of claim 15, wherein the PCB further comprises:

an uppermost patterned metal layer in which the EBG cell array is formed;

a ground plane formed within the PCB at a location beneath the grounded EBG cell array; and EBG vias extending from the grounded EBG cell array, away from the PAM, and to the ground plane to electrically ground the grounded EBG cell array.

17. The PCB of claim 15, wherein at least a portion of the EBG cell array is located between the RF input bondpad and the RF output bondpad, as taken along an axis perpendicular to PCB thickness direction.

18. The PCB of claim 17, further comprising:

a first row of bondpads located on the PCB frontside and flanking a first side of the EBG cell array, the RF input bondpad included in the first row of bondpads; and a second row of bondpads located on the PCB frontside and flanking a second, opposing side of the grounded EBG cell array, the RF output bondpad included in the second row of bondpads.

19. A power amplifier module (PAM) utilized within a power amplifier system, the PAM comprising:

a peaking RF power amplifier die;

a carrier RF power amplifier die;

a module substrate having a die support surface to which the peaking RF power amplifier die and the carrier RF power amplifier die are attached;

a molded body bonded to the die support surface, encapsulating the peaking RF power amplifier die and the carrier RF power amplifier die, and at least partially defining a PAM topside surface;

a topside input/output (I/O) interface formed on the PAM topside surface; and an EBG isolation structure integrated into the module substrate, the EBG isolation structure comprising:

an EBG cell array formed in the die support surface at a location between the peaking RF power amplifier die and the carrier RF power amplifier die and extending between respective pairs of topside RF input terminals and topside RF output terminals of the topside I/O interface;

a ground plane formed in the module substrate at a location beneath the EBG cell array; and EBG vias extending from the EBG cell array, away from the surface of the die support, and to the ground plane to electrically ground the EBG cell array during operation of the PAM.

20. The power amplifier module (PAM) utilized within a power amplifier system of claim 19, wherein the PAM has a Doherty amplifier layout including a carrier amplifier section and a peaking amplifier section, wherein the EBG cell array is located between a carrier amplification signal path and a peaking amplification signal path within the PAM, and wherein the EBG cell array is tuned to provide targeted attenuation of EM energy generated over an operational frequency of the PAM by shunting stray EM energy incident upon the EBG cell array to ground.

* * * * *